(12) United States Patent
Shirai

(10) Patent No.: US 6,482,697 B1
(45) Date of Patent: Nov. 19, 2002

(54) METHOD OF FORMING A HIGHLY INTEGRATED NON-VOLATILE SEMICONDUCTOR MEMORY DEVICE

(75) Inventor: Hiroki Shirai, Tokyo (JP)

(73) Assignee: NEC Corporation, Tokyo (JP)

( * ) Notice: Subject to any disclaimer, the term of this patent is extended or adjusted under 35 U.S.C. 154(b) by 65 days.

(21) Appl. No.: 09/705,880

(22) Filed: Nov. 6, 2000

(30) Foreign Application Priority Data

Nov. 4, 1999 (JP) .......................................... 11-313258

(51) Int. Cl.⁷ ............................................ H01L 21/336
(52) U.S. Cl. ...................... 438/257; 438/211; 438/221; 438/321; 438/697; 438/704
(58) Field of Search ................................ 438/211, 221, 438/229, 230, 260, 261, 266, 321, 697, 257, 699, 704, 926, 152, 158, 692

(56) References Cited

U.S. PATENT DOCUMENTS

| | | | | |
|---|---|---|---|---|
| 5,352,630 A | * | 10/1994 | Kim et al. ................... | 437/195 |
| 5,492,850 A | * | 2/1996 | Ryou ........................... | 437/52 |
| 5,516,625 A | * | 5/1996 | McNamara et al. ......... | 430/314 |
| 5,691,547 A | * | 11/1997 | Manning et al. .............. | 257/67 |
| 5,795,684 A | * | 8/1998 | Troccolo ....................... | 430/5 |
| 6,049,093 A | * | 4/2000 | Manning et al. .............. | 257/67 |
| 6,074,921 A | * | 6/2000 | Lin .............................. | 438/299 |
| 6,127,225 A | * | 10/2000 | Liu et al. ..................... | 438/258 |
| 6,146,954 A | * | 11/2000 | Klein et al. .................. | 438/305 |
| 6,184,076 B1 | * | 2/2001 | Huang ......................... | 438/241 |
| 6,207,543 B1 | * | 3/2001 | Harvey et al. .............. | 438/586 |
| 6,309,947 B1 | * | 10/2001 | Bandyopadhyay et al. . | 438/424 |

* cited by examiner

*Primary Examiner*—Matthew Smith
*Assistant Examiner*—Renzo N. Rocchegiani
(74) *Attorney, Agent, or Firm*—Young & Thompson

(57) ABSTRACT

The present invention provides a method of forming a gate structure of a floating gate MOS field effect transistor. The method comprises the steps of: forming a conductive layer on a gate insulating film; forming a dummy layer over the conductive layer; selectively forming a resist pattern over the dummy layer; carrying out an anisotropic etching process for patterning the dummy layer and the conductive layer by use of the resist pattern as a mask, thereby to form a gate structure removing the resist pattern; forming side wall insulation films on side walls of the gate structure; forming an inter-layer insulator so that the gate structure and the side wall insulation films are completely buried within the inter-layer insulator; carrying out a first planarization process for polishing the inter-layer insulator; and carrying out a second planarization process for selectively etching the inter-layer insulator and the side wall insulation films, so that at least a top portion of the dummy layer is etched; removing the dummy layer; carrying out a third planarization process for selectively etching the inter-layer insulator and the side wall insulation films, so that a planarized surface of the inter-layer insulator and the side wall insulation films is leveled to a planarized surface of the conductive layer, wherein the dummy layer has a higher etching selectivity to the inter-layer insulator than nitride.

31 Claims, 23 Drawing Sheets

//FIG. 5B
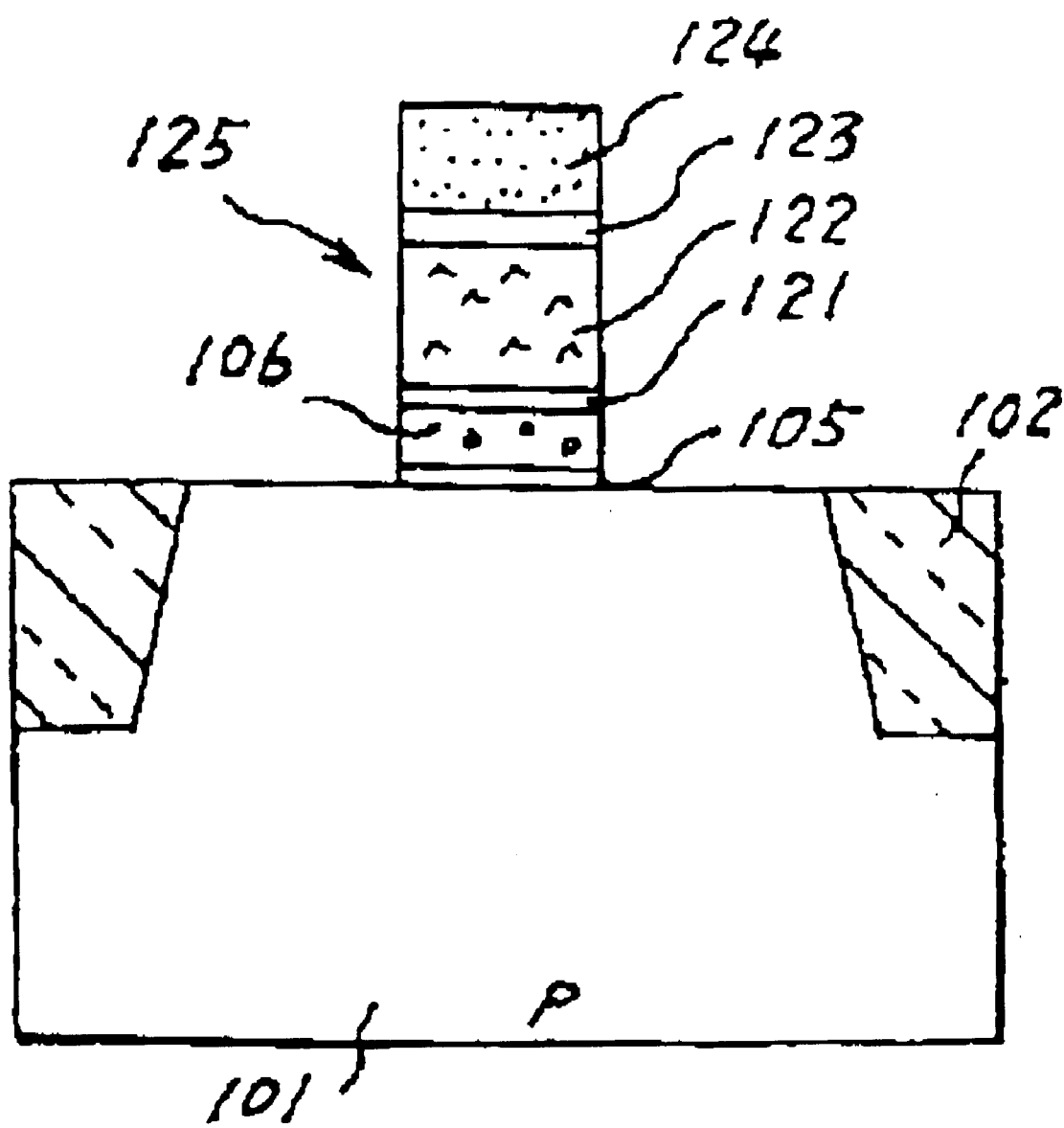

X-memory cell area    Y-peripheral circuit area

METHOD OF FORMING A HIGHLY INTEGRATED NON-VOLATILE SEMICONDUCTOR MEMORY DEVICE

BACKGROUND OF THE INVENTION

The present invention relates to a method of forming a semiconductor memory device, and more particularly to a method of forming a non-volatile semiconductor memory device having a high density integration of size-reduced memory cells having floating gate MOS field effect transistors with an accurately controlled gate length.

FIG. 1 is a fragmentary circuit diagram illustrative of a partial array structure of memory cells having floating gate MOS field effect transistors in the conventional non-volatile semiconductor memory device. Each of the memory cells CELL comprises a pair of a storage capacitor and a floating gate MOS field effect transistor. The memory cell array has a plurality of bit lines BL extending in a first direction. The memory cell array also has a plurality of word lines WL extending in a second direction perpendicular to the first direction. The memory cell array comprises a plurality of memory cell columns, each of which extends along the first direction and between adjacent two of the bit lines BL. Since each of the memory cells has the single pair of the floating gate MOS field effect transistor and the storage capacitor, each of the memory cell columns has a plurality of the floating gate MOS field effect transistors. Each of the floating gate MOS field effect transistors has a source, a drain, a floating gate and a control gate. Sources of the floating gate MOS field effect transistors in the each memory cell column are commonly connected to each other through a common source line. Drains of the floating gate MOS field effect transistors in the each memory cell column are also commonly connected to each other through a common drain line. This common drain line is further connected through a drain selecting transistor SWD to the corresponding bit line BL. The drain selecting transistor SWD has a gate connected to a drain selector line DSEL, so that the common drain line is made connected to the bit line BL in accordance with a drain selecting signal transmitted on the drain selector line DSEL connected to the gate of the drain selecting transistor SWD. A source line SL is further provided which extends in the second direction. The above common source line is connected through a source selecting transistor SWS to the source line SL. The source selecting transistor SWS has a gate connected to a source selector line SSEL, so that the common source line is made connected to the source line SL in accordance with a source selecting signal transmitted on the source selector line SSEL connected to the gate of the source selecting transistor SWS. Each of the memory cell rows comprises the plural floating gate MOS field effect transistors having control gate electrodes connected to the corresponding word line WL. The above circuit configuration forms an AND-type memory. In accordance with the AND-type memory, it is necessary that the sources and drains of the floating gate MOS field effect transistors on the memory cell column TCELLm are separated from the sources and drains of the floating gate MOS field effect transistors on the adjacent memory cell column TCELLn. It is necessary that the control gate electrodes serving as the word line extend in the gate length direction. By contrast to the AND-type memory, a NOR-type memory has a different structure that the source regions of the floating gate MOS field effect transistors on the each memory cell column are common to each other, whilst the drain regions thereof serve as the bit line. A contact is provided for every one or plural memory cells. For these reasons, the control gates of the floating gate MOS field effect transistors extend in the gate width direction. Since as described above, the AND-type memory has the structure that the control gate electrodes serving as the word line extend in the gate length direction, it is impossible that after the control gate and the floating gate have been formed, then the source and drain region are formed. It is necessary for the AND-type memory that the floating gate is firstly formed and then the source and drain regions are secondly formed before the control gate is finally formed.

FIGS. 2A through 2E are fragmentary cross sectional elevation views illustrative of the first conventional method of forming the floating gate MOS field effect transistor included in the AND-type memory. This first conventional method is the applicant's admitted prior art.

With reference to FIG. 2A, shallow trench isolations 202 are selectively formed in an upper region of a p-type silicon substrate 201 thereby to define a memory cell formation region 220 in the upper region of a p-type silicon substrate 201, wherein the memory cell formation region 220 is surrounded by the trench isolations 202. A tunnel gate insulation film 205 is formed on the memory cell formation region 220. A first polycrystalline silicon film 206 is formed on the tunnel gate insulation film 205. A first silicon oxide film 221 is formed on the first polycrystalline silicon film 206. A first silicon nitride film 222 is formed on the first silicon oxide film 221. An antireflective film 223 is formed on the first silicon nitride film 222 to form multilayer laminations. A resist pattern 224 is formed on the antireflective film 223. An anisotropic etching process is carried out by use of the resist pattern 224 as a mask to pattern the multilayer laminations thereby forming a gate structure 225, which comprises the tunnel gate insulation film 205, the first polycrystalline silicon film 206, the first silicon oxide film 221, the first silicon nitride film 222 and the antireflective film 223. The used resist pattern 224 is removed.

With reference to FIG. 2B, a first ion-implantation process is carried out by use of the gate structure 225 as a mask for introducing an n-type impurity into selected upper regions of the memory cell formation region 220 except under the gate structure 225 thereby to selectively form $n^-$-type lightly doped diffusion regions 204 in the selected upper regions of the memory cell formation region 220 except under the gate structure 225, wherein the $n^-$-type lightly doped diffusion regions 204 are defined by the shallow trench isolation regions 202 and are self-aligned to the gate structure 225. An oxide film is entirely formed which extends over the shallow trench isolation regions 202, the $n^-$-type lightly doped diffusion regions 204 and side walls and a top surface of the gate structure 225. An anisotropic etching process is then carried out to the oxide film so as to selectively leave the oxide film on the side walls of the gate structure 225, whereby side wall oxide films 209 are formed on the side walls of the gate structure 225. A second ion-implantation process is carried out by use of the gate structure 225 and the side wall oxide films 209 as a mask for introducing an n-type impurity into selected upper regions of the memory cell formation region 220 except under the gate structure 225 and the side wall oxide films 209 thereby to selectively form $n^+$-type source and drain regions 203S and 203D in the selected upper regions of the memory cell formation region 220 except under the gate structure 225 and the side wall oxide films 209, wherein the $n^+$-type source and drain regions 203S and 203D are defined by the shallow trench isolation regions 202 and are self-aligned to the side wall oxide films 209. As a result, the n -type lightly doped diffusion regions 204 remain under the side wall oxide films 209. The boundaries between the n⁺-type source and drain regions 203S and 203D and the n⁻-type lightly doped diffusion regions 204 are aligned to the outside edges of the side wall oxide films 209.

With reference to FIG. 2C, a first inter-layer insulator 210 is entirely formed over the shallow trench isolation regions 202, the n⁺-type source and drain regions 203S and 203D, the side wall oxide films 209 and the gate structure 225, whereby the side wall oxide films 209 and the gate structure 225 are completely buried within the first inter-layer insulator 210. The first inter-layer insulator 210 comprise a boro-phospho-silicate glass film. A planarization process is carried out to the first inter-layer insulator 210 and the gate structure 225 by a chemical mechanical polishing process, whereby upper regions of the first inter-layer insulator 210 and the gate structure 225 with the side wall oxide films 209 are removed, wherein the silicon nitride film 222 serves as a polishing stopper. The chemical mechanical polishing process is stopped soon after the top surface of the silicon nitride film 222 is shown. Namely, a planarized surface is formed, wherein a planarized top surface of the first inter-layer insulator 210 is leveled to the planarized top surface of the silicon nitride film 222 of the gate structure 225 and also leveled to the planarized top surface of the side wall oxide films 209. The silicon nitride film 222 is much slower in etching rate than the first inter-layer insulator 210, whereby the silicon nitride film 222 is sufficient in serving as the polishing stopper in the chemical mechanical polishing process, thereby preventing the first polycrystalline silicon film 206 from being polished.

With reference to FIG. 2D, the silicon nitride film 222 is removed. Further, the first inter-layer insulator 210 and the side wall oxide films 209 are selectively etched to the same level as the top surface of the first polycrystalline silicon film 206 of the gate structure 225. At the same time, the silicon oxide film 221 is also removed. As a result, an almost planarized surface is formed, wherein the a planarized top surface of the first inter-layer insulator 210 is leveled to the planarized top surface of the first polycrystalline silicon film 206.

With reference to FIG. 2E, a second polycrystalline silicon film 207 is entirely formed over the planarized top surfaces of the first inter-layer insulator 210, the side wall oxide films 209 and the first polycrystalline silicon film 206. The second polycrystalline silicon film 207 is then patterned to form a second polycrystalline silicon pattern 207. The second polycrystalline silicon pattern 207 has a width sufficiently covering the first polycrystalline silicon film 206. The second polycrystalline silicon pattern 207 extends along the column direction perpendicular to the width direction. An ONO inter-gate insulator 208 is entirely formed on the second polycrystalline silicon pattern 207 and the first inter-layer insulator 210. The ONO inter-gate insulator 208 comprises laminations of an oxide film, a nitride film and an oxide film. A third polycrystalline silicon film 211 is entirely formed on the ONO inter-gate insulator 208. Laminations of the third polycrystalline silicon film 211, the ONO inter-gate insulator 208, the second polycrystalline silicon pattern 207 and the first polycrystalline silicon film 206 are selectively etched or patterned to have the laminations extend in the row direction. The third polycrystalline silicon film 211 forms a control gate electrode as a word line. The first polycrystalline silicon film 206 and the second polycrystalline silicon pattern 207 form a floating gate electrode. As a result, the floating gate MOS field effect transistor is completed.

As described above, the conventional method utilizes the nitride film 222 which serves as a polishing stopper in the chemical mechanical polishing process, wherein the nitride film 222 is much larger in polishing selectivity than the first polycrystalline silicon film 206 and the first inter-layer insulator 210 of boro-phospho-silicate glass. Namely, the nitride film 222 is used as a dummy film. On the other hand, the resist film 224 is used for shaping the gate structure 225. The nitride film 222 has an etching selectivity of about 0.56 to the resist film 224. Namely, the nitride film 222 is lower in etching selectivity than the resist film 224. This means it difficult to form the nitride film 222 in highly accurate dimension or in highly accurate width. The resist film 224 overlying the antireflective layer 223 is used as a mask for selectively etching the antireflective layer 223, the nitride film 222, the silicon oxide film 221 and the first polycrystalline silicon film 206. The nitride film 222 is lower in etching selectivity than the resist film 224. Namely, the nitride film 222 is lower in etching rate than the resist film 224, for which reason opposite side edges of the resist film 224 are over-etched, whereby a horizontal size of the resist film 224 is reduced from the designed size, before the above gate structure 225 is completely defined by this etching process. The over-etched and size-reduced resist film 224 causes the nitride film 222 to be also over-etched in horizontal direction and to be reduced in horizontal size, whereby the nitride film 222 gradually varies in horizontal size, so that the horizontal size of the nitride film 222 is gradually reduced upwardly. namely, the side walls of the nitride film 222 are not vertical rather sloped. the cross sectional vertical shape of the nitride film 222 is trapezoid. The over-etched and size-reduced resist film 224 further causes the silicon oxide film 221 and the first polycrystalline silicon film 206 to be also over-etched in horizontal direction and to be reduced in horizontal size. The above horizontal size reductions of the nitride film 222, the silicon oxide film 221 and the first polycrystalline silicon film 206 means that the gate structure 225 is reduced in horizontal size. This means that the gate structure 225 is reduced in size in the gate length direction. The n⁻-type lightly doped diffusion regions 204 are self-aligned to the edges of the gate structure 225. The reduction in size in the gate length direction of the gate structure 225 causes variation in position of the inner edges of the n⁻-type lightly doped diffusion regions 204, whereby a channel length defined between the inner edges of the n⁻-type lightly doped diffusion regions 204 is reduced. This variation in channel length causes variations in characteristics and performances of the memory cells, for example, the necessary times of writing and erasing data, and ON-current for reading out data. This makes it difficult to realize advanced memory cells having 0.22 micrometers gate length.

In the above circumstances, it had been required to develop a novel method of forming a non-volatile semiconductor memory device free from the above problem.

SUMMARY OF THE INVENTION

Accordingly, it is an object of the present invention to provide a novel method of forming a non-volatile semiconductor memory device free from the above problems.

It is a further object of the present invention to provide a novel method of forming a non-volatile semiconductor memory device free from any substantive variation in channel length.

It is a still further object of the present invention to provide a novel method of forming a non-volatile semiconductor memory device being highly reliable in characteristics and performances.

It is yet a further object of the present invention to provide a novel method of forming a non-volatile semiconductor memory device free from any substantive variations in the necessary times of writing and erasing data, and in ON-current for reading out data.

It is another object of the present invention to provide a novel method of forming a gate structure of a floating gate MOS field effect transistor for a semiconductor memory device free from the above problems.

It is further another object of the present invention to provide a novel method of forming a gate structure of a floating gate MOS field effect transistor for a semiconductor memory device free from any substantive variation in channel length.

It is still further another object of the present invention to provide a novel method of forming a gate structure of a floating gate MOS field effect transistor for a semiconductor memory device being highly reliable in characteristics and performances.

It is yet further another object of the present invention to provide a novel method of forming a gate structure of a floating gate MOS field effect transistor for a semiconductor memory device free from any substantive variations in the necessary times of writing and erasing data, and in ON-current for reading out data.

The first present invention provides a method of patterning a conductive layer buried in an inter-layer insulator. The method comprises the steps of: forming a dummy layer over a conductive layer; selectively forming a resist pattern over the dummy layer; carrying out an anisotropic etching process for patterning the dummy layer and the conductive layer by use of the resist pattern as a mask; removing the resist pattern; forming an inter-layer insulator so that the dummy layer and the conductive layer are completely buried within the inter-layer insulator; carrying out a first planarization process for polishing the inter-layer insulator; and carrying out a second planarization process for selectively etching the inter-layer insulator, so that at least a top portion of the dummy layer is etched removing the dummy layer; carrying out a third planarization process for selectively etching the inter-layer insulator, so that a planarized surface of the inter-layer insulator is leveled to a planarized surface of the conductive layer, wherein the dummy layer has a higher etching selectivity to the inter-layer insulator than nitride.

The second present invention provides a method of forming a gate structure of a floating gate MOS field effect transistor. The method comprises the steps of: forming a conductive layer on a gate insulating film; forming a dummy layer over the conductive layer; selectively forming a resist pattern over the dummy layer; carrying out an anisotropic etching process for patterning the dummy layer and the conductive layer by use of the resist pattern as a mask, thereby to form a gate structure; removing the resist pattern; forming side wall insulation films on side walls of the gate structure; forming an inter-layer insulator so that the gate structure and the side wall insulation films are completely buried within the inter-layer insulator; carrying out a first planarization process for polishing the inter-layer insulator; and carrying out a second planarization process for selectively etching the inter-layer insulator and the side wall insulation films, so that at least a top portion of the dummy layer is etched; removing the dummy layer; carrying out a third planarization process for selectively etching the inter-layer insulator and the side wall insulation films, so that a planarized surface of the inter-layer insulator and the side wall insulation films is leveled to a planarized surface of the conductive layer, wherein the dummy layer has a higher etching selectivity to the inter-layer insulator than nitride.

The third present invention provides a dummy layer pattern provided over a conductive layer pattern buried in an inter-layer insulator for protecting the conductive layer pattern from being over-polished by a chemical mechanical polishing process, wherein the dummy layer pattern has a higher etching selectivity to the inter-layer insulator than nitride.

The above and other objects, features and advantages of the resent invention will be apparent from the following descriptions.

BRIEF DESCRIPTION OF THE DRAWINGS

Preferred embodiments according to the present invention will be described in detail with reference to the accompanying drawings.

FIGS. 5A through 5L are fragmentary cross sectional elevation views illustrative of floating gate MOS field effect transistors in each of semiconductor memory cells in sequential fabrication steps involved in the novel fabrication method in the first preferred embodiment in accordance with the present invention.

DISCLOSURE OF THE INVENTION

Figure 1:
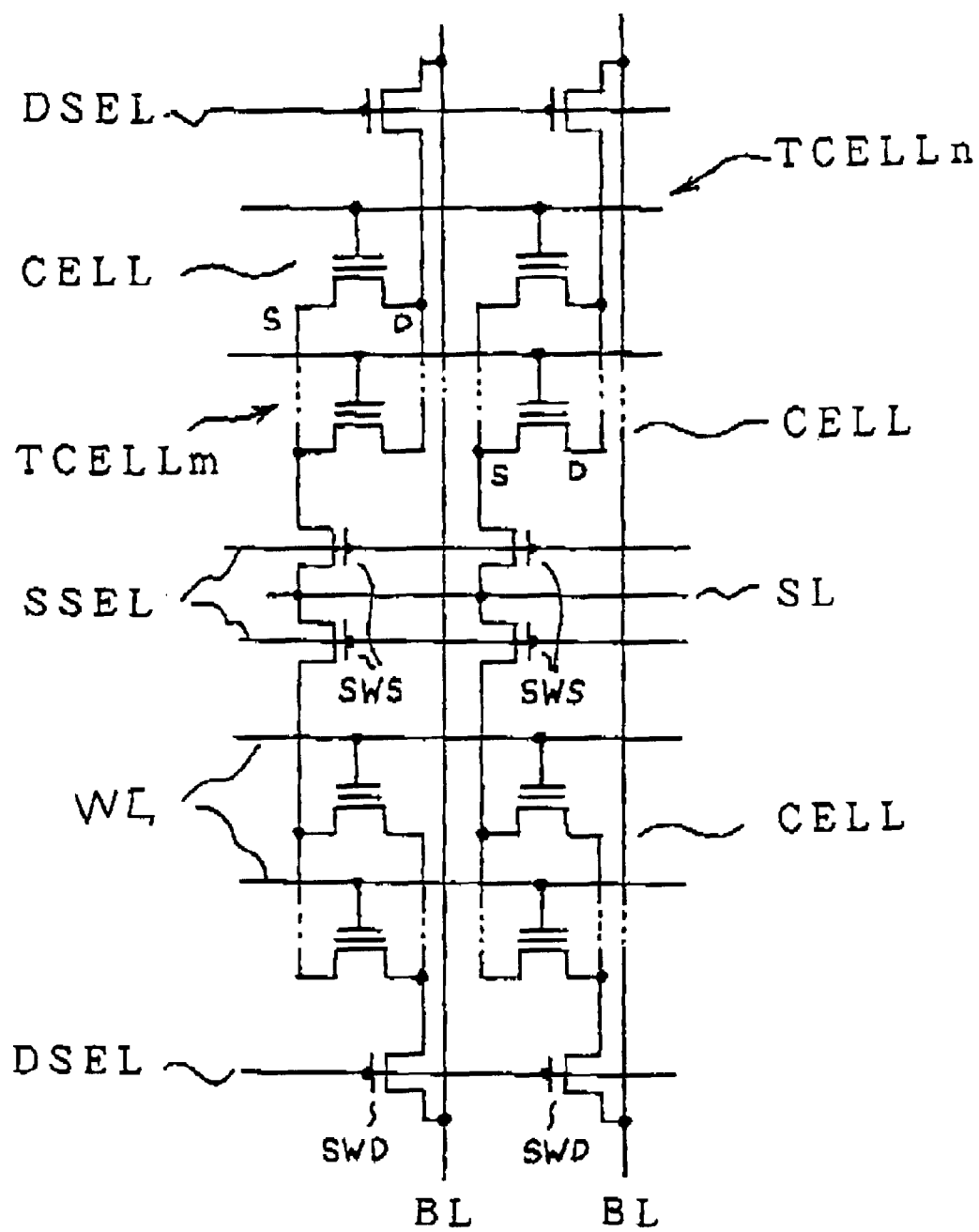
FIG. 1 is a fragmentary circuit diagram illustrative of a partial array structure of memory cells having floating gate MOS field effect transistors in the conventional non-volatile semiconductor memory device. Each of the memory cells CELL comprises a pair of a storage capacitor and a floating gate MOS field effect transistor.
Figure 2A:
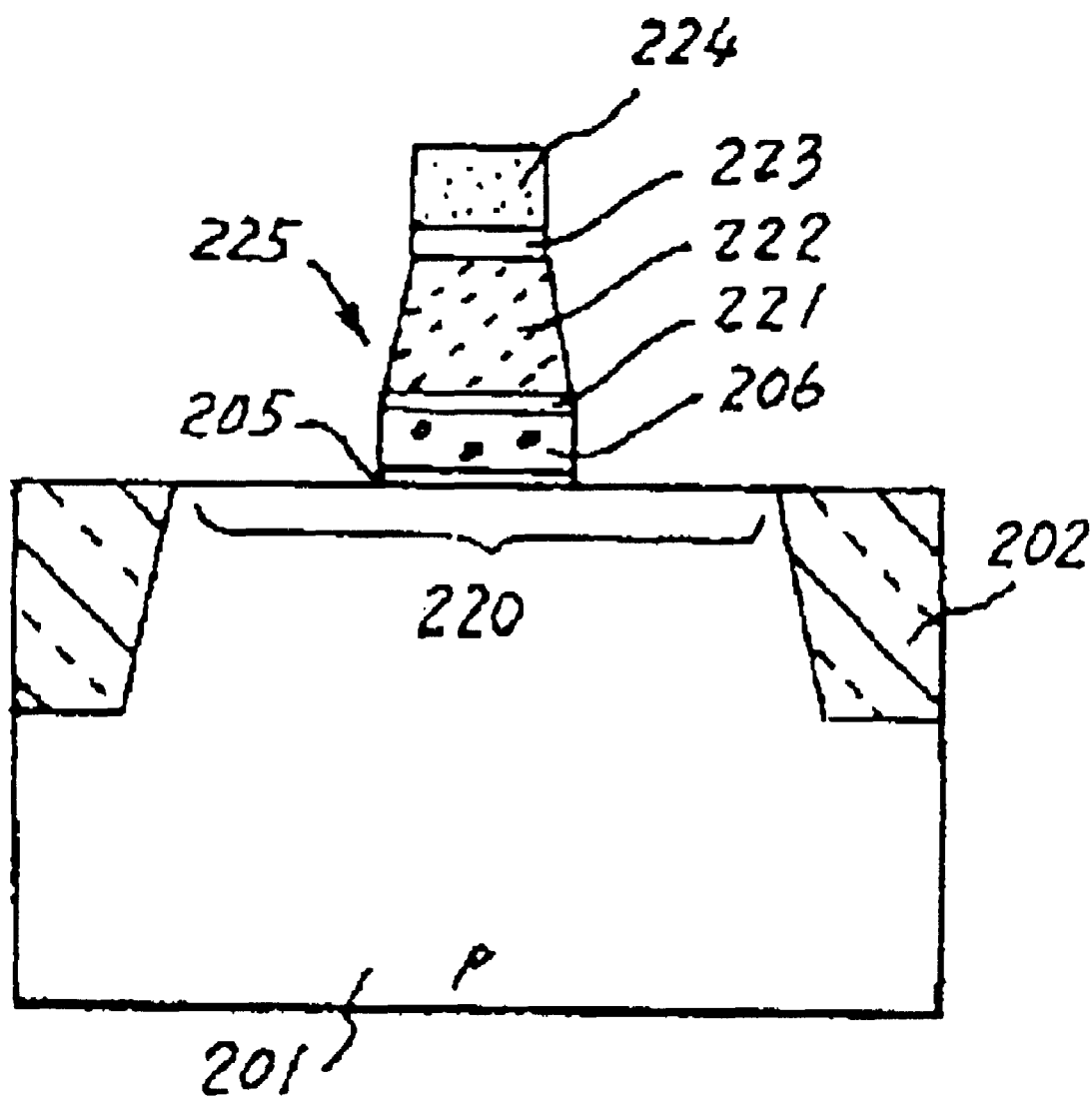
FIGS. 2A through 2E are fragmentary cross sectional elevation views illustrative of the first conventional method of forming the floating gate MOS field effect transistor included in the AND-type memory. This first conventional method is the applicant's admitted prior art.
Figure 2B:
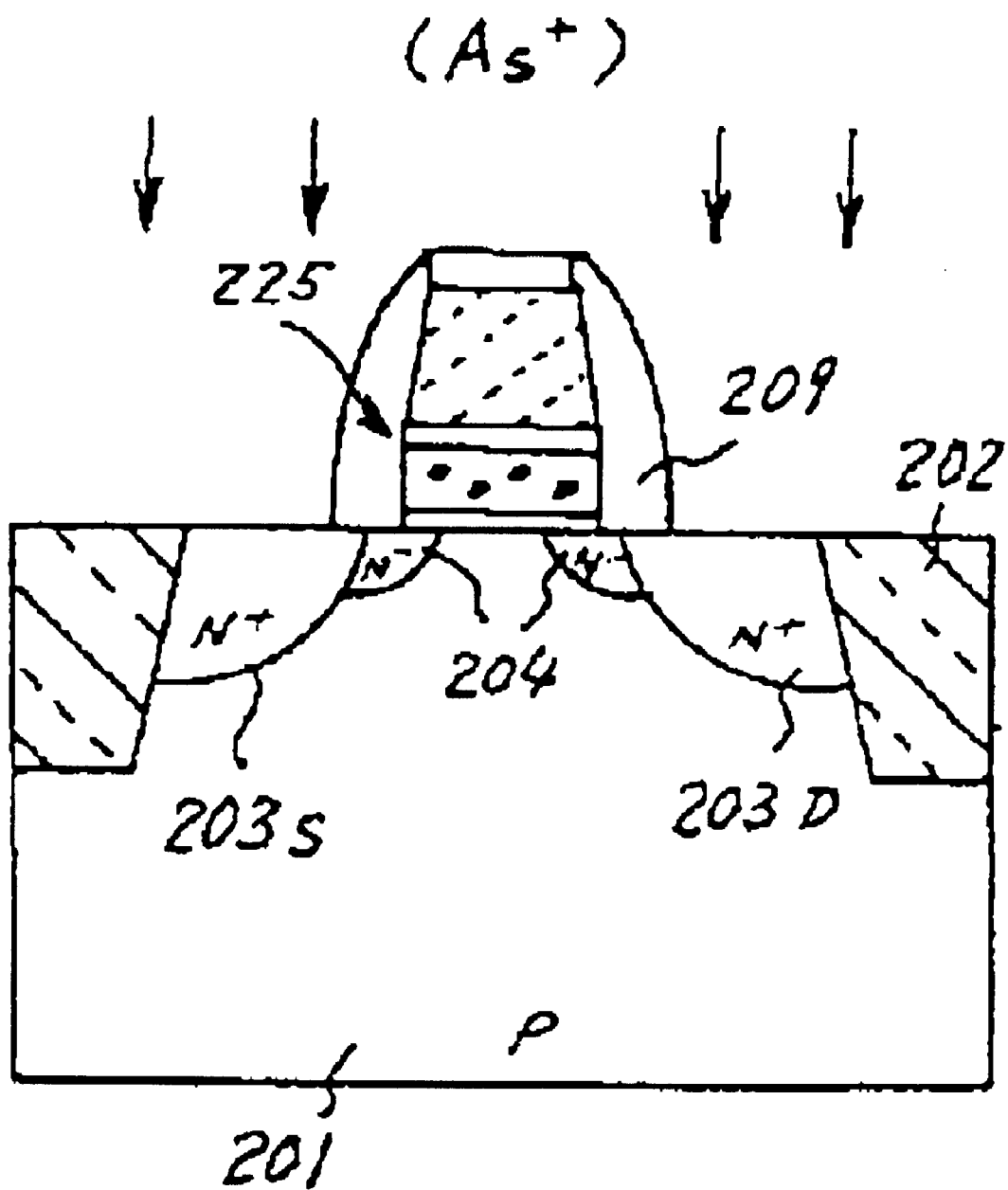
Figure 2C:
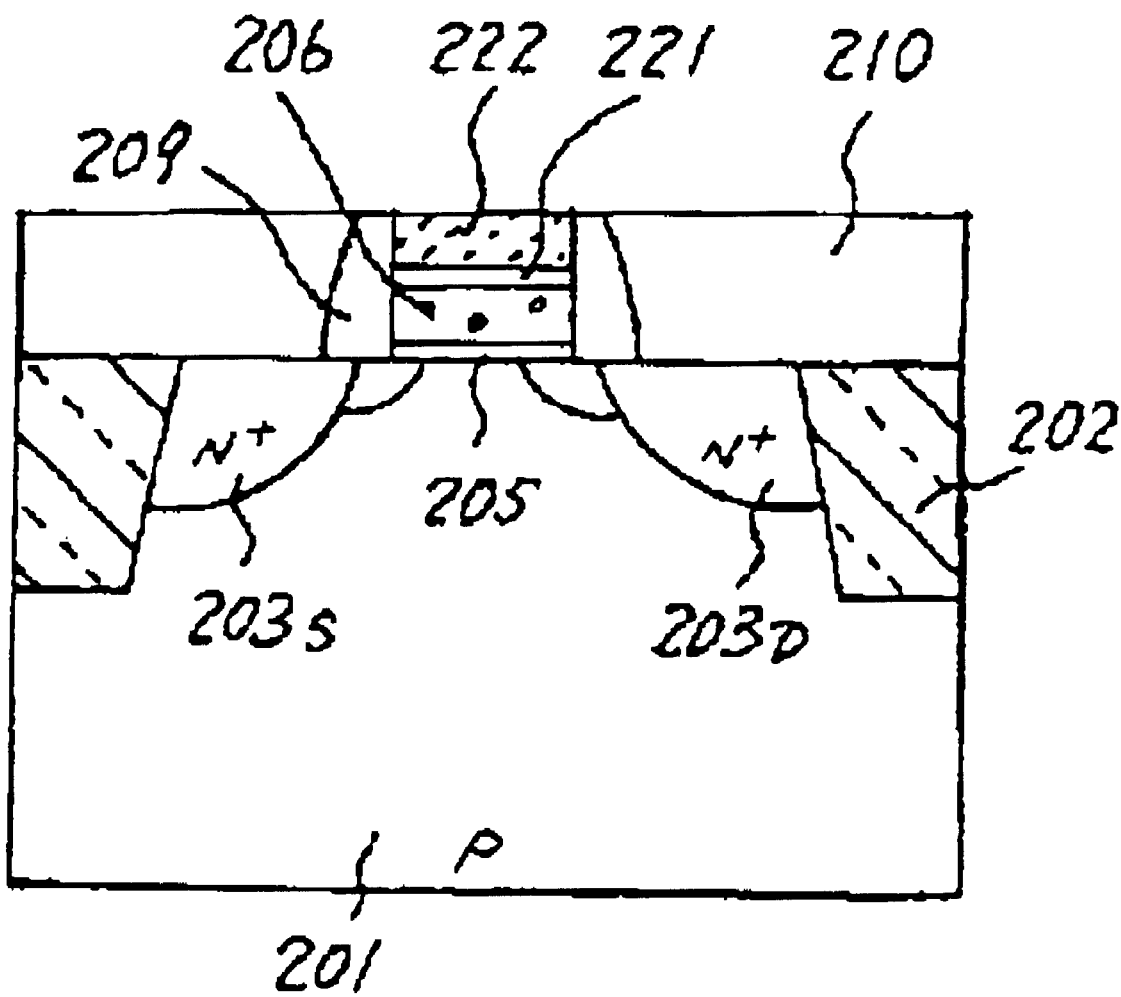
Figure 2D:
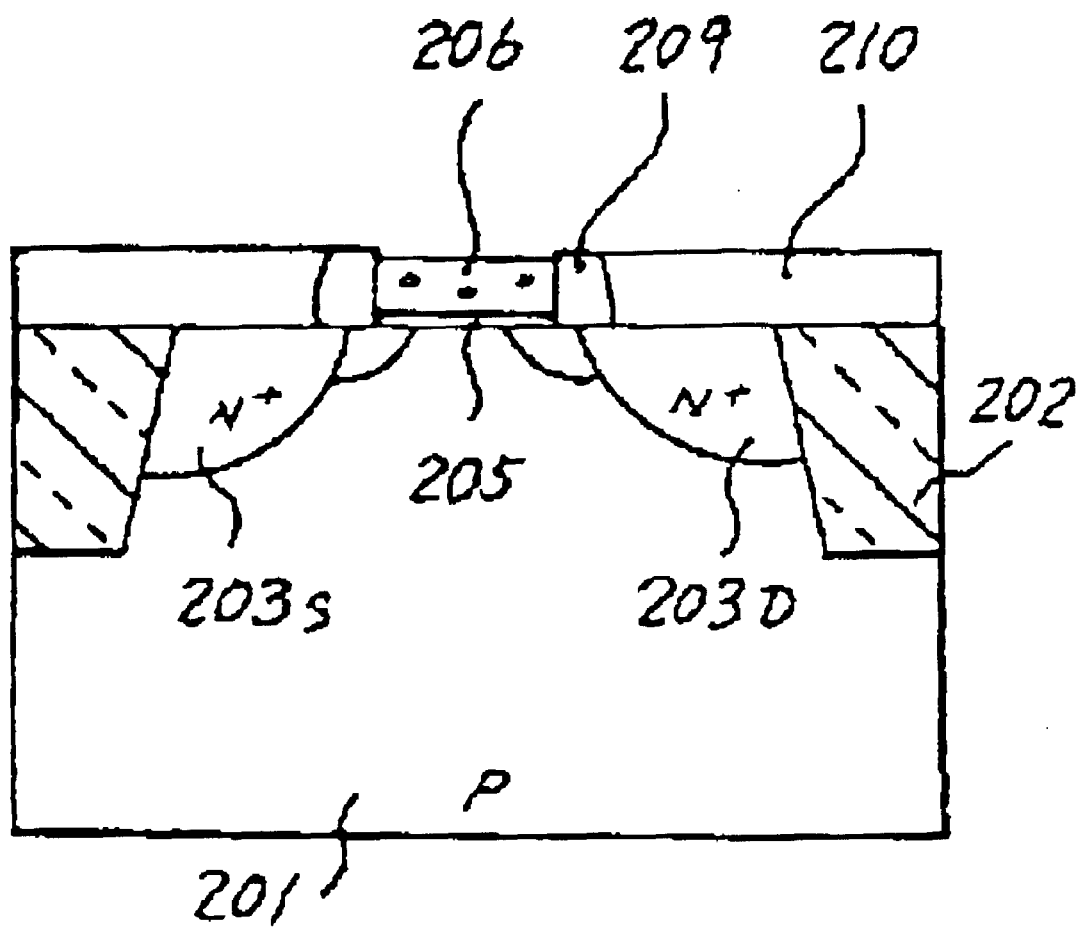
Figure 2E:
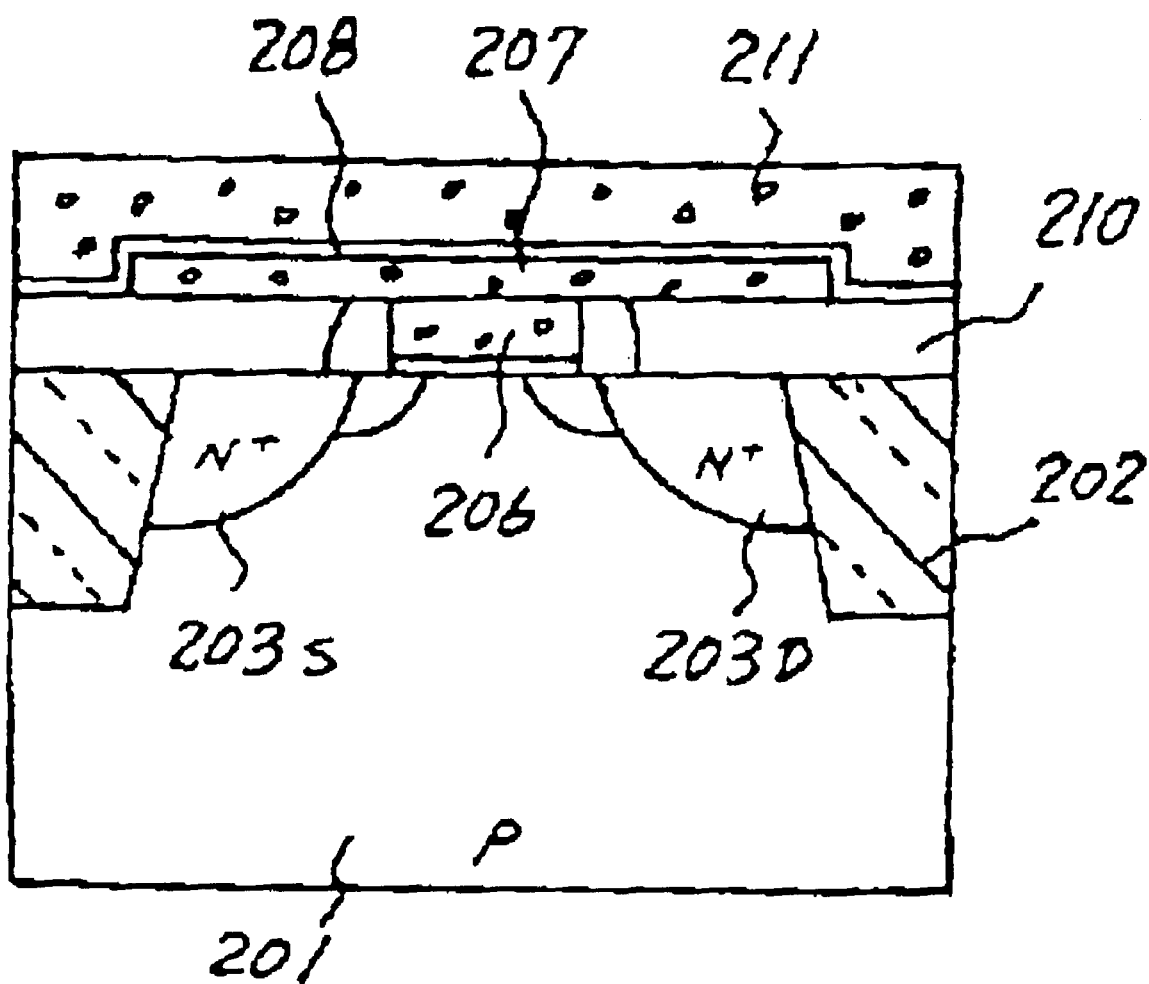

The first present invention provides a method of patterning a conductive layer buried in an inter-layer insulator. The method comprises the steps of: forming a dummy layer over a conductive layer; selectively forming a resist pattern over the dummy layer; carrying out an anisotropic etching process for patterning the dummy layer and the conductive layer by use of the resist pattern as a mask; removing the resist pattern; forming an inter-layer insulator so that the dummy layer and the conductive layer are completely buried within the inter-layer insulator; carrying out a first planarization process for polishing the inter-layer insulator; and carrying out a second planarization process for selectively etching the inter-layer insulator, so that at least a top portion of the dummy layer is etched removing the dummy layer; carrying out a third planarization process for selectively etching the inter-layer insulator, so that a planarized surface of the inter-layer insulator is leveled to a planarized surface of the conductive layer, wherein the dummy layer has a higher etching selectivity to the inter-layer insulator than nitride.

In accordance with the first present invention, the dummy layer which serves as a polishing stopper in the chemical mechanical polishing process has a higher etching selectivity to the inter-layer insulator than nitride. The resist film is used for shaping the gate structure. The dummy layer has a higher etching selectivity to the resist film than about 0.56. Namely, the dummy layer is higher in etching selectivity than the nitride film used in the conventional method. This means it possible to form the dummy layer in highly accurate dimension or in highly accurate width. The resist film overlying the dummy layer is used as a mask for selectively etching the dummy layer and the conductive film. The dummy layer is not so lower in etching selectivity than the resist film. Namely, the dummy layer is not so lower in etching rate than the resist film, for which reason opposite side edges of the resist film are not over-etched, whereby a horizontal size of the resist film remains unchanged at the designed size, even after the above gate structure is completely defined by the etching process. The over-etching-free and size-reduction-free resist film causes the dummy layer to be free of any over-etching in horizontal direction and to remain unchanged in horizontal size, whereby the dummy layer remains unchanged in horizontal size, so that the horizontal size of the dummy layer remains unchanged in the vertical direction or the thickness direction. Namely, the side walls of the dummy layer are vertical. The cross sectional vertical shape of the dummy layer is rectangle. The over-etching-free and size-reduction-free resist film further causes the conductive layer to be also free from any over-etching in horizontal direction and to remain unchanged in horizontal size. The above horizontal size unchanges of the dummy layer and the conductive layer means that the gate structure remains unchanged in horizontal size. This means that the gate structure remains unchanged in size in the gate length direction. Lightly doped diffusion regions are self-aligned to the edges of the gate structure. No variation in size in the gate length direction of the gate structure causes no variation in position of the inner edges of the lightly doped diffusion regions, whereby a channel length defined between the inner edges of the lightly doped diffusion regions is reduced. No variation in channel length causes no variations in characteristics and performances of the memory cells, for example, the necessary times of writing and erasing data, and ON-current for reading out data. This makes it possible to realize advanced memory cells having 0.22 micrometers gate length.

It is possible that the dummy layer comprises an amorphous silicon layer.

It is also possible that the dummy layer comprises a polycrystalline silicon layer.

It is also possible that the dummy layer comprises a CVD oxide layer.

It is also possible that the dummy layer comprises a plasma enhanced silicon oxide layer.

It is also possible that the dummy layer comprises a boro-phospho-silicate glass layer.

It is also possible that the second and third planarization processes are plasma etching processes.

It is also possible that the second and third planarization processes are wet etching processes.

It is also possible that the first planarization process is a chemical mechanical polishing process.

It is also possible that the dummy layer is removed by a dry etching process.

It is also possible that the conductive layer comprises an impurity-doped polycrystalline silicon layer.

It is also possible to further comprise the step of: forming a silicon oxide film on the polycrystalline silicon layer before the dummy layer is formed on the silicon oxide film and over the polycrystalline silicon layer.

It is also possible to further comprise the step of: forming an antireflective layer on the dummy layer before the resist film is selectively formed on the antireflective layer and over the dummy layer.

It is also possible that the first inter-layer insulator comprises a oro-phospho-silicate glass film.

It is also possible that the dummy layer and the conductive layer as patterned have a width of not more than about 0.22 micrometers.

The second present invention provides a method of forming a gate structure of a floating gate MOS field effect transistor. The method comprises the steps of: forming a conductive layer on a gate insulating film; forming a dummy layer over the conductive layer; selectively forming a resist pattern over the dummy layer; carrying out an anisotropic etching process for patterning the dummy layer and the conductive layer by use of the resist pattern as a mask, thereby to form a gate structure removing the resist pattern; forming side wall insulation films on side walls of the gate structure forming an inter-layer insulator so that the gate structure and the side wall insulation films are completely buried within the inter-layer insulator; carrying out a first planarization process for polishing the inter-layer insulator; and carrying out a second planarization process for selectively etching the inter-layer insulator and the side wall insulation films, so that at least a top portion of the dummy layer is etched; removing the dummy layer; carrying out a third planarization process for selectively etching the inter-layer insulator and the side wall insulation films, so that a planarized surface of the inter-layer insulator and the side wall insulation films is leveled to a planarized surface of the conductive layer, wherein the dummy layer has a higher etching selectivity to the inter-layer insulator than nitride.

In accordance with the second present invention, the dummy layer which serves as a polishing stopper in the chemical mechanical polishing process has a higher etching selectivity to the inter-layer insulator than nitride. The resist film is used for shaping the gate structure. The dummy layer has a higher etching selectivity to the resist film than about 0.56. Namely, the dummy layer is higher in etching selectivity than the nitride film used in the conventional method. This means it possible to form the dummy layer in highly accurate dimension or in highly accurate width. The resist film overlying the dummy layer is used as a mask for selectively etching the dummy layer and the conductive film. The dummy layer is not so lower in etching selectivity than the resist film. Namely, the dummy layer is not so lower in etching rate than the resist film, for which reason opposite side edges of the resist film are not over-etched, whereby a horizontal size of the resist film remains unchanged at the designed size, even after the above gate structure is completely defined by the etching process. The over-etching-free and size-reduction-free resist film causes the dummy layer to be free of any over-etching in horizontal direction and to remain unchanged in horizontal size, whereby the dummy layer remains unchanged in horizontal size, so that the horizontal size of the dummy layer remains unchanged in the vertical direction or the thickness direction. Namely, the side walls of the dummy layer are vertical. The cross sectional vertical shape of the dummy layer is rectangle. The over-etching-free and size-reduction-free resist film further causes the conductive layer to be also free from any over-etching in horizontal direction and to remain unchanged in horizontal size. The above horizontal size unchanges of the dummy layer and the conductive layer means that the gate structure remains unchanged in horizontal size. This means that the gate structure remains unchanged in size in the gate length direction. Lightly doped diffusion regions are self-aligned to the edges of the gate structure. No variation in size in the gate length direction of the gate structure causes no variation in position of the inner edges of the lightly doped diffusion regions, whereby a channel length defined between the inner edges of the lightly doped diffusion regions is reduced. No variation in channel length causes no variations in -characteristics and performances of the memory cells, for example, the necessary times of writing and erasing data, and ON-current for reading out data. This makes it possible to realize advanced memory cells having 0.22 micrometers gate length.

It is preferable that the dummy layer comprises an amorphous silicon layer.

It is also preferable that the dummy layer comprises a polycrystalline silicon layer.

It is also preferable that the dummy layer comprises a CVD oxide layer.

It is also preferable that the dummy layer comprises a plasma enhanced silicon oxide layer.

It is also preferable that the dummy layer comprises a boro-phospho-silicate glass layer.

It is also preferable that the second and third planarization processes are plasma etching processes.

It is also preferable that the second and third planarization processes are wet etching processes.

It is also preferable that the first planarization process is a chemical mechanical polishing process.

It is also preferable that the dummy layer is removed by a dry etching process.

It is also preferable that the conductive layer comprises an impurity-doped polycrystalline silicon layer.

It is also preferable to further comprise the step of: forming a silicon oxide film on the polycrystalline silicon layer before the dummy layer is formed on the silicon oxide film and over the polycrystalline silicon layer.

It is also preferable to further comprise the step of: forming an antireflective layer on the dummy layer before the resist film is selectively formed on the antireflective layer and over the dummy layer.

It is also preferable that the first inter-layer insulator comprises a boro-phospho-silicate glass film.

It is also preferable that the dummy layer and the conductive layer as patterned have a width of not more than about 0.22 micrometers.

It is also preferable to further comprise the steps of: selectively forming a capacitive conductive film extending on at least an entire top surface region of the conductive layer, so that the capacitive conductive film and the conductive layer forms a floating gate electrode; forming an inter-gate insulation film over the capacitive conductive film; forming a second conductive film over the capacitive insulation film, wherein the second conductive film forms a control gate electrode.

The third present invention provides a dummy layer pattern provided over a conductive layer pattern buried in an inter-layer insulator for protecting the conductive layer pattern from being over-polished by a chemical mechanical polishing process, wherein the dummy layer pattern has a higher etching selectivity to the inter-layer insulator than nitride.

In accordance with the third present invention, the dummy layer which serves as a polishing stopper in the chemical mechanical polishing process has a higher etching selectivity to the inter-layer insulator than nitride. The resist film is used for shaping the gate structure. The dummy layer has a higher etching selectivity to the resist film than about 0.56. Namely, the dummy layer is higher in etching selectivity than the nitride film used in the conventional method. This means it possible to form the dummy layer in highly accurate dimension or in highly accurate width. The resist film overlying the dummy layer is used as a mask for selectively etching the dummy layer and the conductive film. The dummy layer is not so lower in etching selectivity than the resist film. Namely, the dummy layer is not so lower in etching rate than the resist film, for which reason opposite side edges of the resist film are not over-etched, whereby a horizontal size of the resist film remains unchanged at the designed size, even after the above gate structure is completely defined by the etching process. The over-etching-free and size-reduction-free resist film causes the dummy layer to be free of any over-etching in horizontal direction and to remain unchanged in horizontal size, whereby the dummy layer remains unchanged in horizontal size, so that the horizontal size of the dummy layer remains unchanged in the vertical direction or the thickness direction. Namely, the side walls of the dummy layer are vertical. The cross sectional vertical shape of the dummy layer is rectangle. The over-etching-free and size-reduction-free resist film further causes the conductive layer to be also free from any over-etching in horizontal direction and to remain unchanged in horizontal size. The above horizontal size unchanges of the dummy layer and the conductive layer means that the gate structure remains unchanged in horizontal size. This means that the gate structure remains unchanged in size in the gate length direction. Lightly doped diffusion regions are self-aligned to the edges of the gate structure. No variation in size in the gate length direction of the gate structure causes no variation in position of the inner edges of the lightly doped diffusion regions, whereby a channel length defined between the inner edges of the lightly doped diffusion regions is reduced. No variation in channel length causes no variations in characteristics and performances of the memory cells, for example, the necessary times of writing and erasing data, and ON-current for reading out data. This makes it possible to realize advanced memory cells having 0.22 micrometers gate length.

It is preferable that the dummy layer pattern comprises an amorphous silicon layer.

It is also preferable that the dummy layer pattern comprises a polycrystalline silicon layer.

It is also preferable that the dummy layer pattern comprises a CVD oxide layer.

It is also preferable that the dummy layer dummy layer pattern a plasma enhanced silicon oxide layer.

It is also preferable that the dummy layer dummy layer pattern a boro-phospho-silicate glass layer.

PREFERRED EMBODIMENT

Figure 3A:
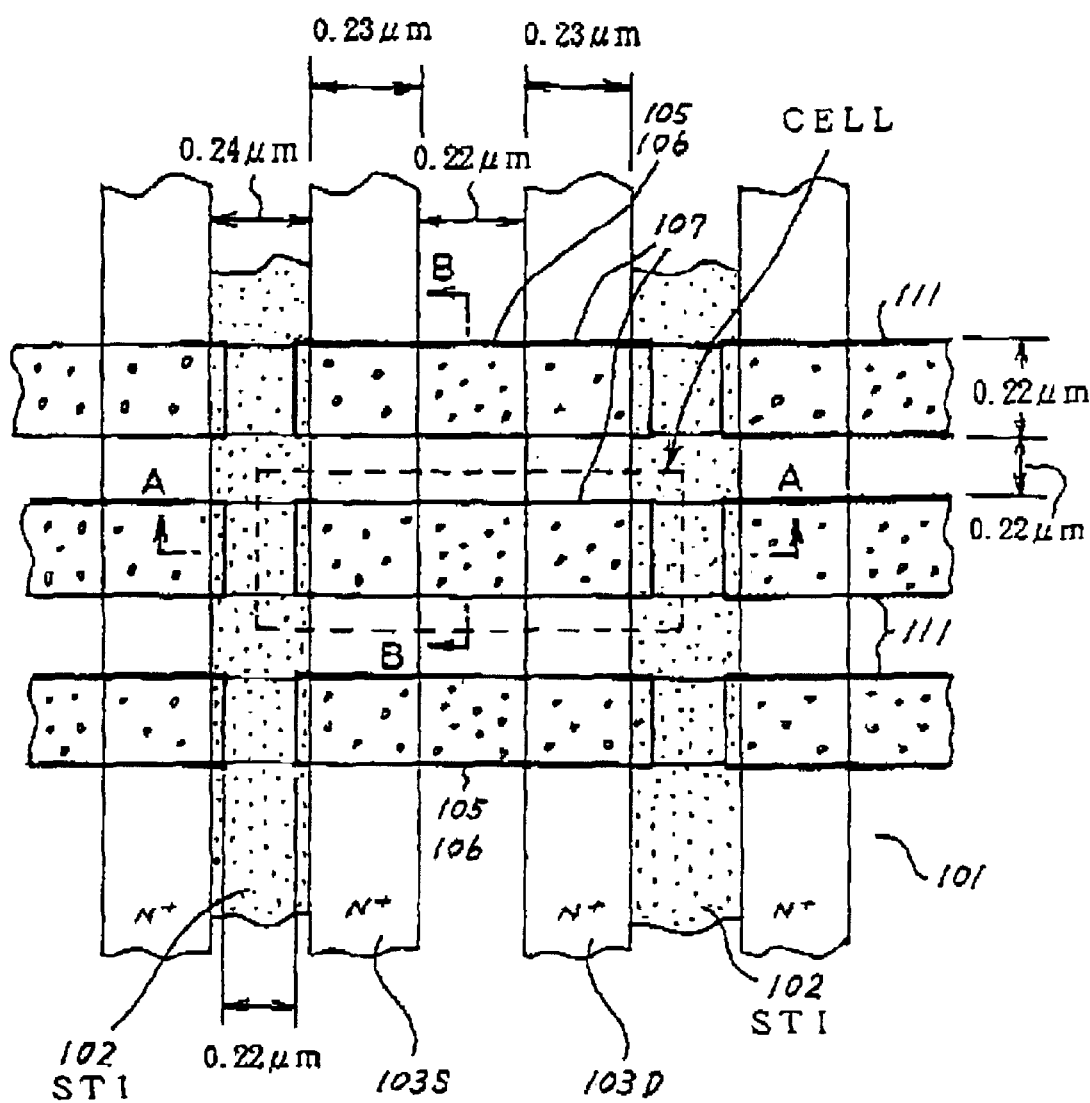
FIG. 3A is a fragmentary plane view illustrative of a semiconductor memory device having an AND-type memory cell structure in a first preferred embodiment in accordance with the present invention.
Figure 3B:
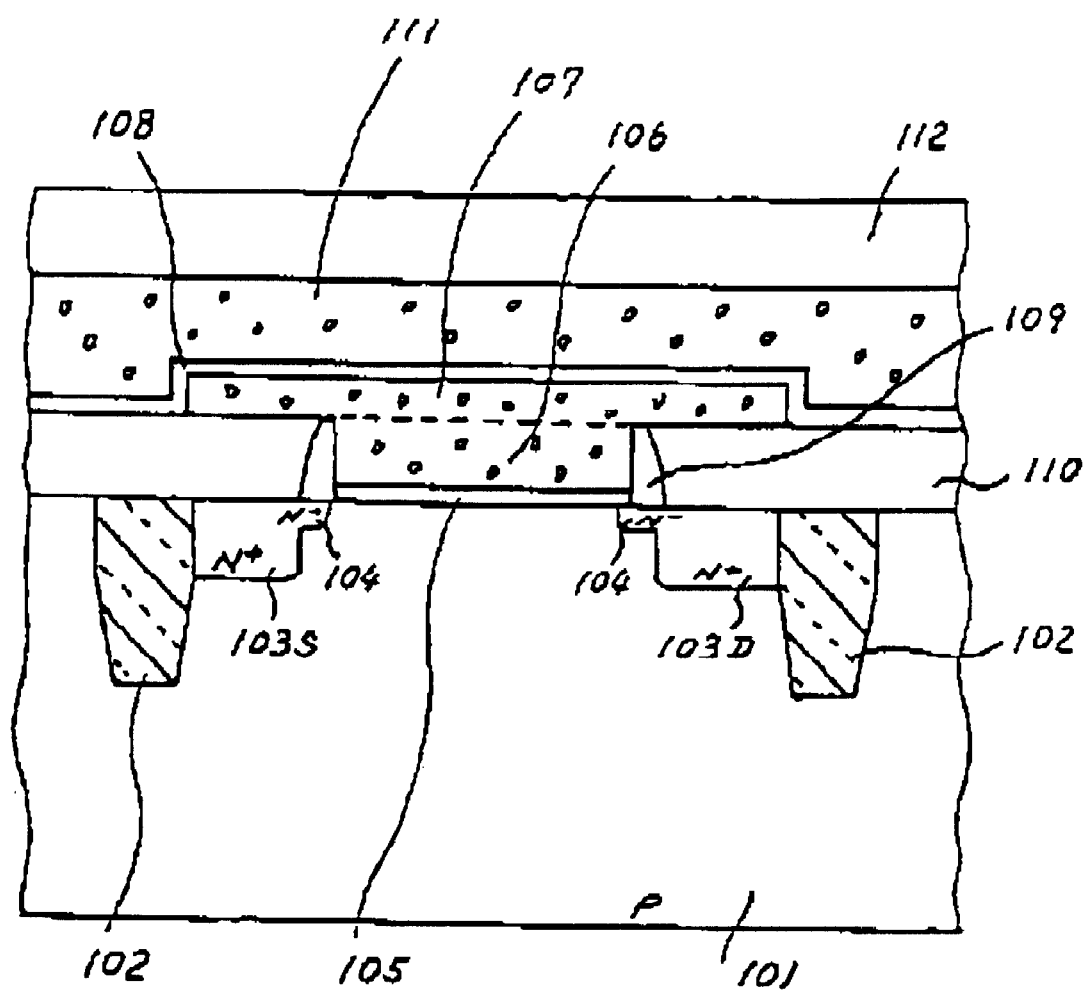
FIG. 3B is a fragmentary cross sectional elevation view taken along an A—A line of FIG. 3 illustrative of a semiconductor memory device having an AND-type memory cell structure in a first preferred embodiment in accordance with the present invention.
Figure 3C:
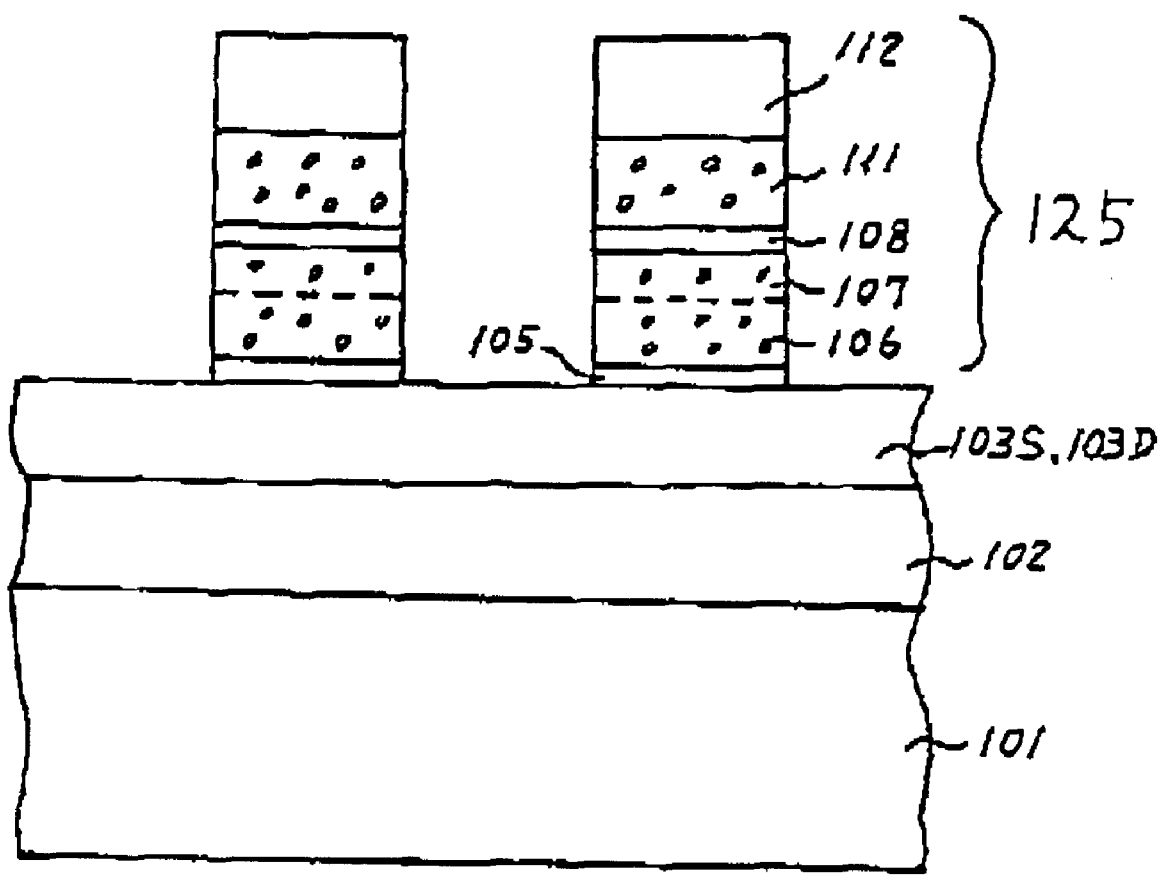
FIG. 3C is a fragmentary cross sectional elevation view taken along a B—B line of FIG. 3 illustrative of a semiconductor memory device having an AND-type memory cell structure in a first preferred embodiment in accordance with the present invention.
Figure 4:
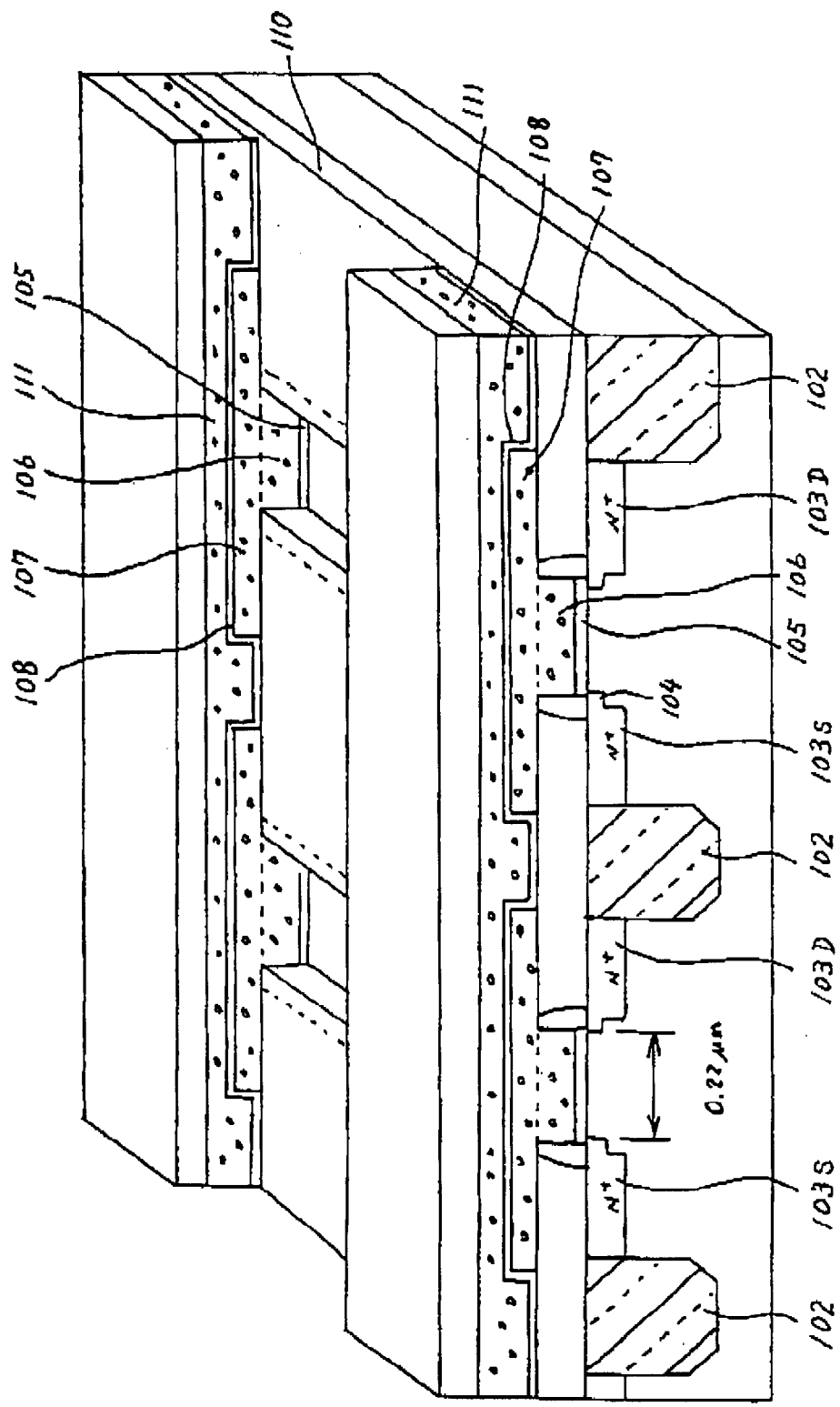
FIG. 4 is a fragmentary perspective view illustrative of a semiconductor memory device having an AND-type memory cell structure in a first preferred embodiment in accordance with the present invention.

A first embodiment according to the present invention will be described in detail with reference to the drawings. FIG. 3A is a fragmentary plane view illustrative of a semiconductor memory device having an AND-type memory cell structure in a first preferred embodiment in accordance with the present invention. FIG. 3B is a fragmentary cross sectional elevation view taken along an A—A line of FIG. 3 illustrative of a semiconductor memory device having an AND-type memory cell structure in a first preferred embodiment in accordance with the present invention. FIG. 3C is a fragmentary cross sectional elevation view taken along a B—B line of FIG. 3 illustrative of a semiconductor memory device having an AND-type memory cell structure in a first preferred embodiment in accordance with the present invention. FIG. 4 is a fragmentary perspective view illustrative of a semiconductor memory device having an AND-type memory cell structure in a first preferred embodiment in accordance with the present invention.

The novel semiconductor memory device is formed over a p-type silicon substrate 101. A plurality of shallow trench isolations STI 102 of silicon oxide are formed in selected upper regions of the p-type silicon substrate 101, wherein the shallow trench isolations STI 102 extend in a column direction. A plurality of memory cell formation regions are defined between the shallow trench isolations STI 102. In each of the memory cell formation regions, a pair of n-type source and drain regions 103S and 103D is provided, wherein the n-type source and drain regions 103S and 103D extend in the column direction and also in parallel to the shallow trench isolations STI 102. Outside edges of the n-type source and drain regions 103S and 103D are bounded with the inside edges of the shallow trench isolations STI 102. Lightly-doped drain regions 104 are provided which extend from the inside edges of the n-type source and drain regions 103S and 103D. The lightly-doped drain regions 104 extend in the column direction and also in parallel to the n-type source and drain regions 103S and 103D. A channel region is defined between the inside edges of the lightly-doped drain regions 104. A tunnel gate insulation film 105 is provided which extends on the channel region. A polycrystalline silicon floating gate electrode 106 is provided on the tunnel gate insulation film 105. Side wall insulation films 109 are provided on side walls of the laminations of polycrystalline silicon floating gate electrode 106 and the tunnel gate insulation film 105. The side wall insulation films 109 comprise silicon oxide films. The lightly-doped drain regions 104 are positioned under the side wall insulation films 109. The inside edges of the lightly-doped drain regions 104 are self-aligned to the boundary between the side wall insulation films 109 and the side walls of the laminations of polycrystalline silicon floating gate electrode 106 and the tunnel gate insulation film 105. A first inter-layer insulator 110 is provided which extends over the n-type source and drain regions 103S and 103D and the shallow trench isolations STI 102. The first inter-layer insulator 110 surrounds the side wall insulation films 109 and the side walls of the laminations of polycrystalline silicon floating gate electrode 106 and the tunnel gate insulation film 105 The first inter-layer insulator 110 comprises a boro-phospho-silicate glass film. The first inter-layer insulator 110 has a planarized top surface which is leveled to the planarized top surfaces of the side walls of the laminations of polycrystalline silicon floating gate electrode 106. The boundary between the side wall insulation films 109 and the first inter-layer insulator 110 are self-aligned to the boundary between the n-type source and drain regions 103S and 103D and the lightly-doped drain regions 104. A polycrystalline silicon capacitive layer 107 is provided which extends over the planarized top surfaces of the first inter-layer insulator 110, the side wall oxide films 109 and the polycrystalline silicon floating gate electrode 106, so that the outside edges of the polycrystalline silicon capacitive layer 107 are aligned to the boundaries between the n-type source and drain regions 103S and 103D and the shallow trench isolations 102. The polycrystalline silicon capacitive layer 107 is in contact with the polycrystalline silicon floating gate electrode 106. An inter-gate insulator 108 is entirely provided on the polycrystalline silicon capacitive layer 107 and the first inter-layer insulator 110. A plurality of polycrystalline silicon control gate electrode layers 111 are provided which extends on the inter-gate insulator 108. The plurality of polycrystalline silicon control gate electrode layers 111 extend in row direction perpendicular to the column direction. The plurality of polycrystalline silicon control gate electrode layers 111 serve as word lines. A top insulation film 112 is provided on the polycrystalline silicon control gate electrode layers 111. A plurality of gate structures 125 are provided over the substrate 101, wherein each of the gate structures 125 comprises laminations of the tunnel gate insulation film 105, the polycrystalline silicon floating gate electrode 106, the polycrystalline silicon capacitive layer 107, the inter-gate insulator 108, the polycrystalline silicon control gate electrode layer 111 and the top insulation film 112. Each of the gate structures 125 extends in the row direction.

In accordance with the AND-type memory device, the memory cells are aligned in the memory cell formation region defined between the shallow trench isolation regions, The drain region of the each memory cell is connected through a selective block drain selector gate to a bit line. The source region of the each memory cell is connected through a selective block source selector gate to a source line.

FIGS. 5A through 5L are fragmentary cross sectional elevation views illustrative of floating gate MOS field effect transistors in each of semiconductor memory cells in sequential fabrication steps involved in the novel fabrication method in the first preferred embodiment in accordance with the present invention.

Figure 5A:
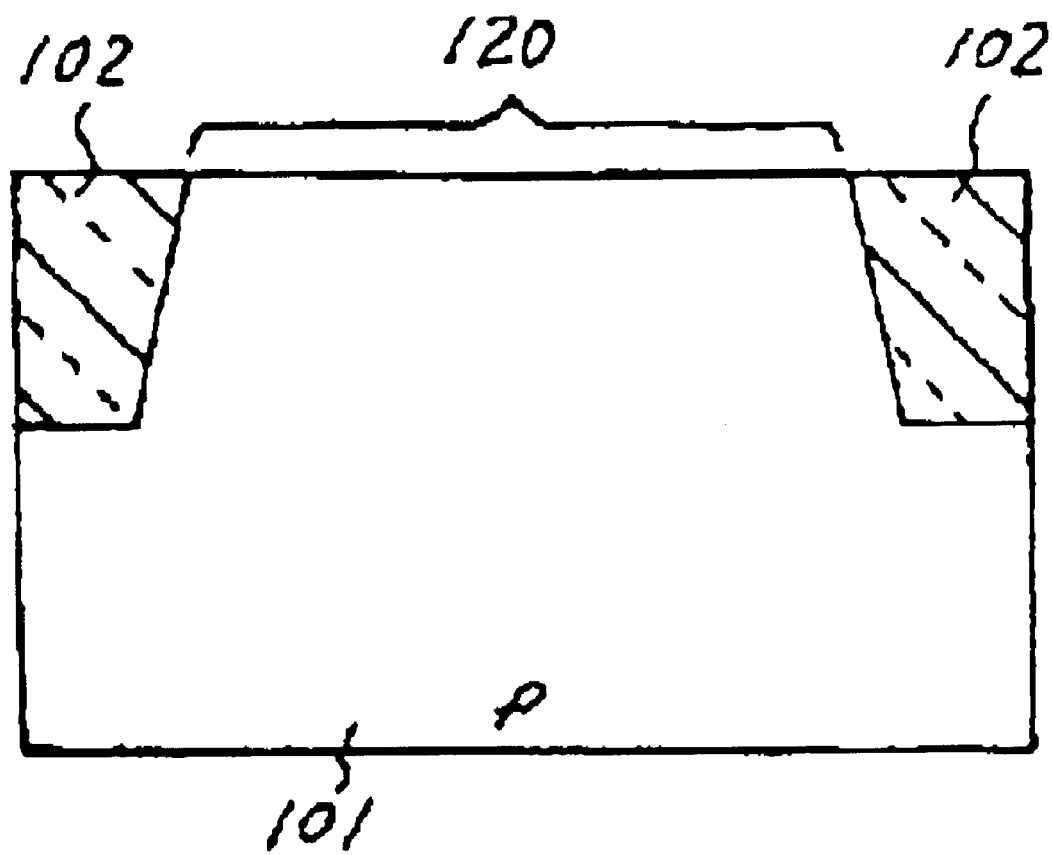

With reference to FIG. 5A, shallow trench isolations STI 102 are selectively formed in upper regions of a p-type silicon substrate 101, wherein the shallow trench isolations STI 102 extend in the column direction. The shallow trench isolations STI 102 may be formed as follow. A selective etching method is carried out by use of a resist pattern formed over the top surface of the p-type silicon substrate 101, to selectively form shallow trenches in upper regions of the p-type silicon substrate 101. The shallow trenches extend in the column direction. A silicon oxide film is entirely deposited so that the silicon oxide film completely fills the shallow trenches and extends over the top surface of the p-type silicon substrate 101. A chemical mechanical polishing process is then carried out for polishing the silicon oxide film so that the silicon oxide film remains only the shallow trenches, thereby forming the plural shallow trench isolations STI 102 extending in the column direction have a row direction size of about 0.24 micrometers. The each memory cell formation region 120 defined between the adjacent two of the shallow trench isolations STI 102 also extends in the column direction and has a row direction size of about 0.68 micrometers.

With reference to FIG. 5B, a tunnel gate insulation film 105 of silicon oxide is formed by a thermal oxidation on the each memory cell formation region 120. The tunnel gate insulation film 105 has a thickness of 90 angstroms. A polycrystalline silicon floating gate electrode layer 106 is formed on the tunnel gate insulation film 105. The polycrystalline silicon floating gate electrode layer 106 has a thickness of 1000 angstroms. A silicon oxide film 121 is formed on the polycrystalline silicon floating gate electrode layer 106. The silicon oxide film 121 has a thickness of 250 angstroms. An amorphous silicon dummy layer 122 is formed on the silicon oxide film 121. The amorphous silicon dummy layer 122 has a thickness of 2000 angstroms. The amorphous silicon dummy layer 122 serves as a dummy layer in the later process of chemical mechanical polishing. An anti-reflective layer 123 is formed on the amorphous silicon dummy layer 122. The anti-reflective layer 123 has a thickness in the range of 100–350 angstroms. A resist pattern 124 is selectively formed on the anti-reflective layer 123. An anisotropic etching process is carried out by use of the resist pattern 124 as a mask for selectively etching laminations of the anti-reflective layer 123, the amorphous silicon dummy layer 122, the silicon oxide film 121, the polycrystalline silicon floating gate electrode layer 106 and the tunnel gate insulation film 105, thereby to form a gate structure 125 which comprises the patterned laminations of the anti-reflective layer 123, the amorphous silicon dummy layer 122, the silicon oxide film 121, the polycrystalline silicon floating gate electrode layer 106 and the tunnel gate insulation film 105. The gate structure 125 has a row direction size of about 0.22 micrometers. The gate structure 125 extends in the column direction. The gate structure 125 extends on the selected region of the memory cell formation region 120 defined between the adjacent two of the shallow trench isolations 102. The above selective anisotropic etching process is the plasma etching process. For etching the anti-reflective layer 123, $CF_4$ gas is used. For the amorphous silicon dummy layer 122, $Cl_2$+HBr gas is used. For both the silicon oxide film 121 and the tunnel gate insulation film 105, $CF_4$ gas is used. For the polycrystalline silicon floating gate electrode layer 106, $Cl_2$+HBr gas is used. The etching selectivity of the amorphous silicon dummy layer 122 to the resist pattern 124 is in the range of 1–2. The etching selectivity of the nitride layer to the resist pattern 124 is 0.56. Namely, the amorphous silicon dummy layer 122 is larger in etching selectivity to the resist pattern 124 than the nitride layer, for which reason opposite side edges of the resist film 124 are not over-etched, whereby a horizontal size of the resist film 124 remains unchanged from the designed size, even after the above gate structure 125 is completely defined by this etching process. The over-etching-free and size-reduction-free resist film 124 makes the amorphous silicon dummy layer 122 free from any over-etching in horizontal direction and remain unchanged in horizontal size, whereby the amorphous silicon dummy layer 122 remains unchanged in horizontal size, so that the horizontal size of the amorphous silicon dummy layer 122 is constant in the vertical direction or the thickness direction. Namely, the side walls of the amorphous silicon dummy layer 122 are just vertical. The cross sectional vertical shape of the amorphous silicon dummy layer 122 is rectangle. The over-etching-free and size-reduction-free resist film 124 further causes the silicon oxide film 121 and the polycrystalline silicon floating gate electrode layer 106 to be free from any over-etching in horizontal direction and to remain unchanged in horizontal size. The above horizontal size unchanges of the amorphous silicon dummy layer 122, the silicon oxide film 121 and the polycrystalline silicon floating gate electrode layer 106 means that the gate structure 125 remains unchanged in horizontal size. This means that the gate structure 125 is reduced in size in the gate length direction.

Figure 5C:
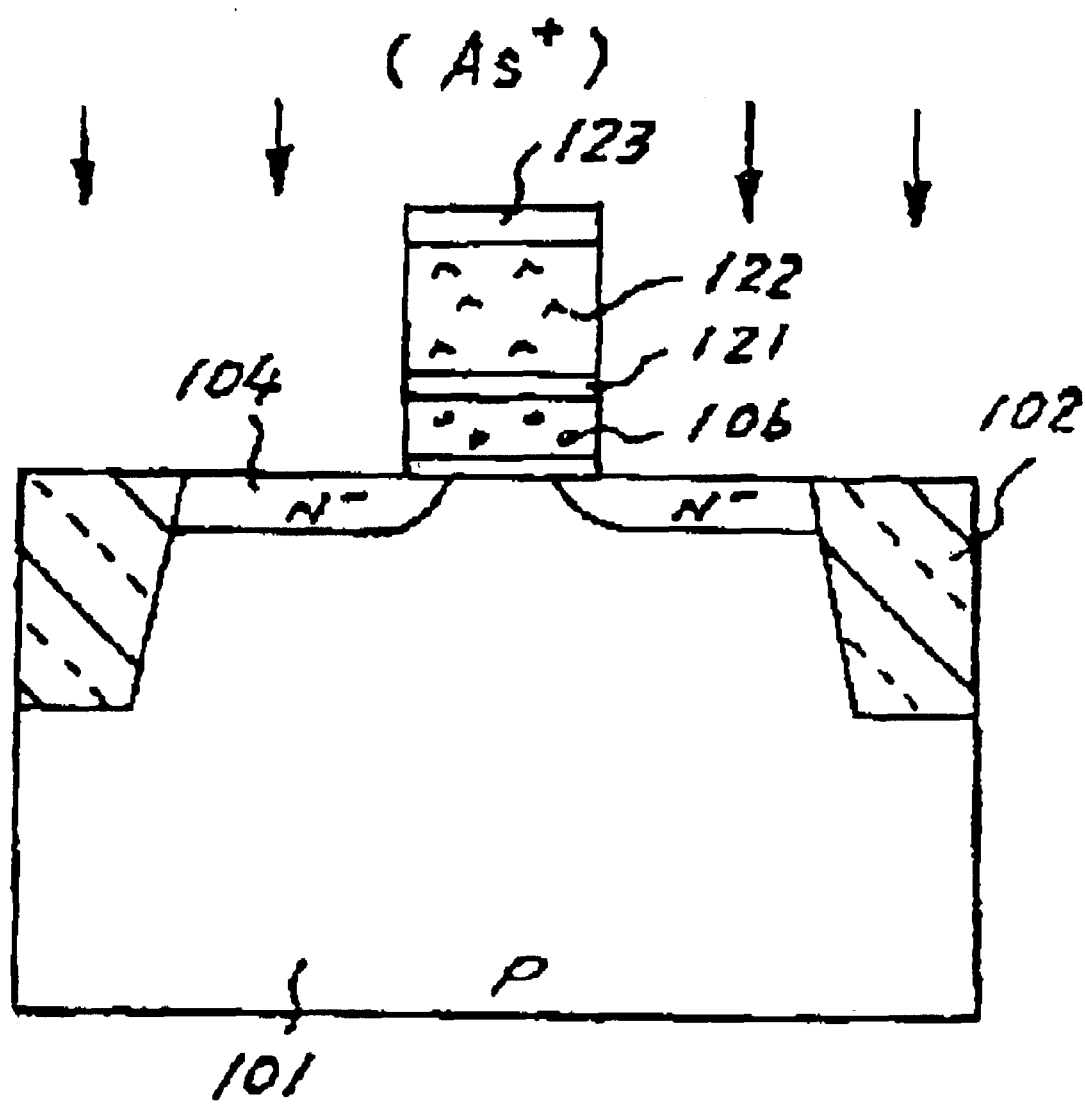

With reference to FIG. 5C, the used resist pattern 124 is removed. A first ion-implantation process is carried out by use of the gate structure 125 as a mask for selectively introducing an n-type impurity such as arsenic at a low impurity concentration of $3E13/cm^2$ into selected upper regions of the memory cell formation region 120 except under the gate structure 125 thereby to selectively form $n^-$-type lightly doped diffusion regions 104 in the selected upper regions of the memory cell formation region 120 except under the gate structure 125, wherein the $n^-$-type lightly doped diffusion regions 104 are defined by the shallow trench isolation regions 102 and are self-aligned to the gate structure 125.

Figure 5D:
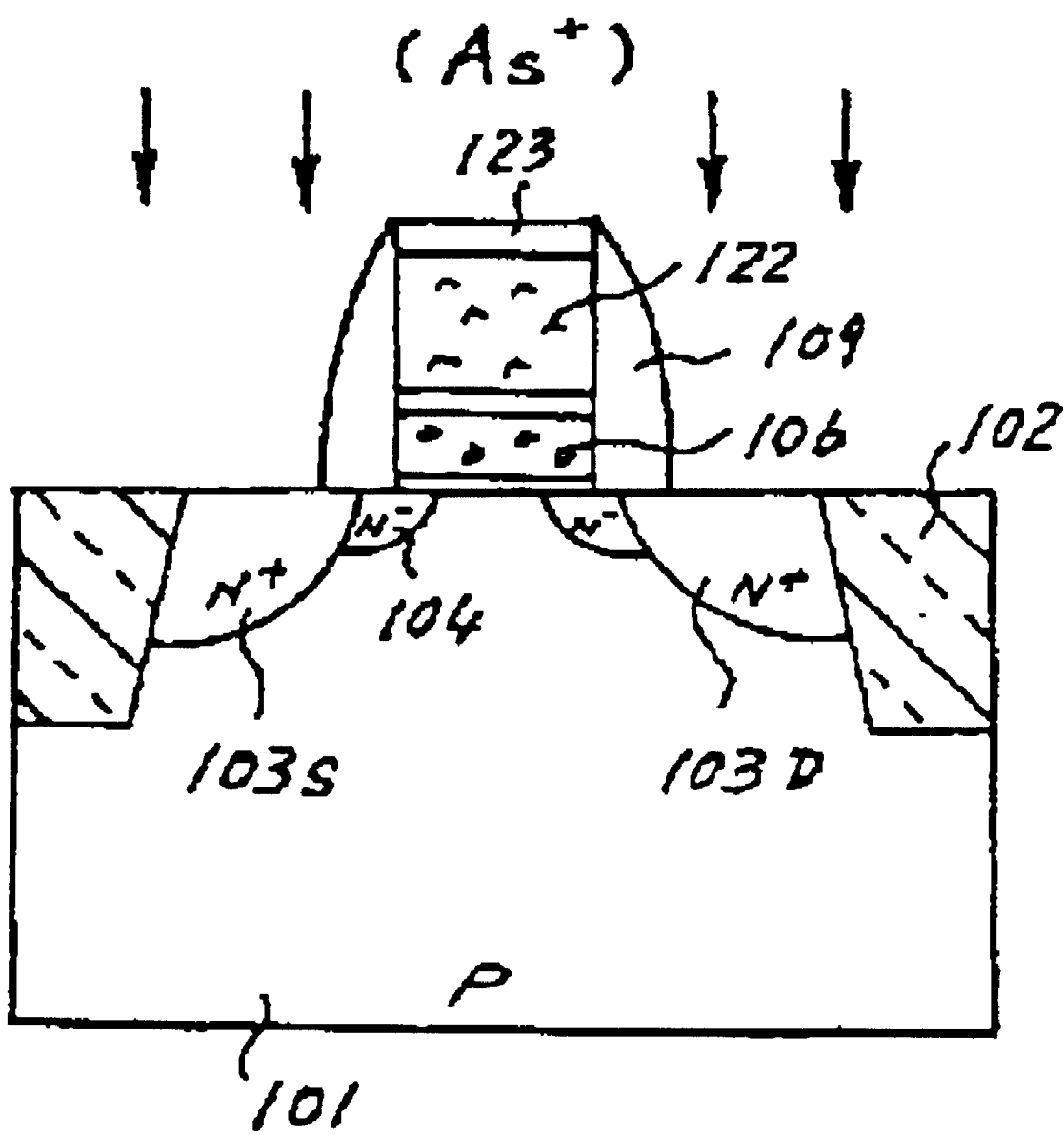

With reference to FIG. 5D, an oxide film is entirely formed which extends over the shallow trench isolation regions 102, the $n^-$-type lightly doped diffusion regions 104 and side walls and a top surface of the gate structure 125 by a chemical vapor deposition method. An anisotropic etching process is then carried out to the oxide film so as to selectively leave the oxide film on the side walls of the gate structure 125, whereby side wall oxide films 109 are formed on the side walls of the gate structure 125. A second ion-implantation process is carried out by use of the gate structure 125 and the side wall oxide films 109 as a mask for introducing an n-type impurity such as arsenic into selected upper regions of the memory cell formation region 120 except under the gate structure 125 and the side wall oxide films 109 at a high impurity concentration of $4E15/cm2$ thereby to selectively form $n^+$-type source and drain regions 103S and 103D in the selected upper regions of the memory cell formation region 120 except under the gate structure 125 and the side wall oxide films 109, wherein the $n^+$-type source and drain regions 103S and 103D are defined by the shallow trench isolation regions 102 and are self-aligned to the side wall oxide films 109. As a result, the $n^-$-type lightly doped diffusion regions 104 remain under the side wall oxide films 109. The boundaries between the $n^+$-type source and drain regions 103S and 103D and the $n^-$-type lightly doped diffusion regions 104 are aligned to the outside edges of the side wall oxide films 109.

Figure 5E:
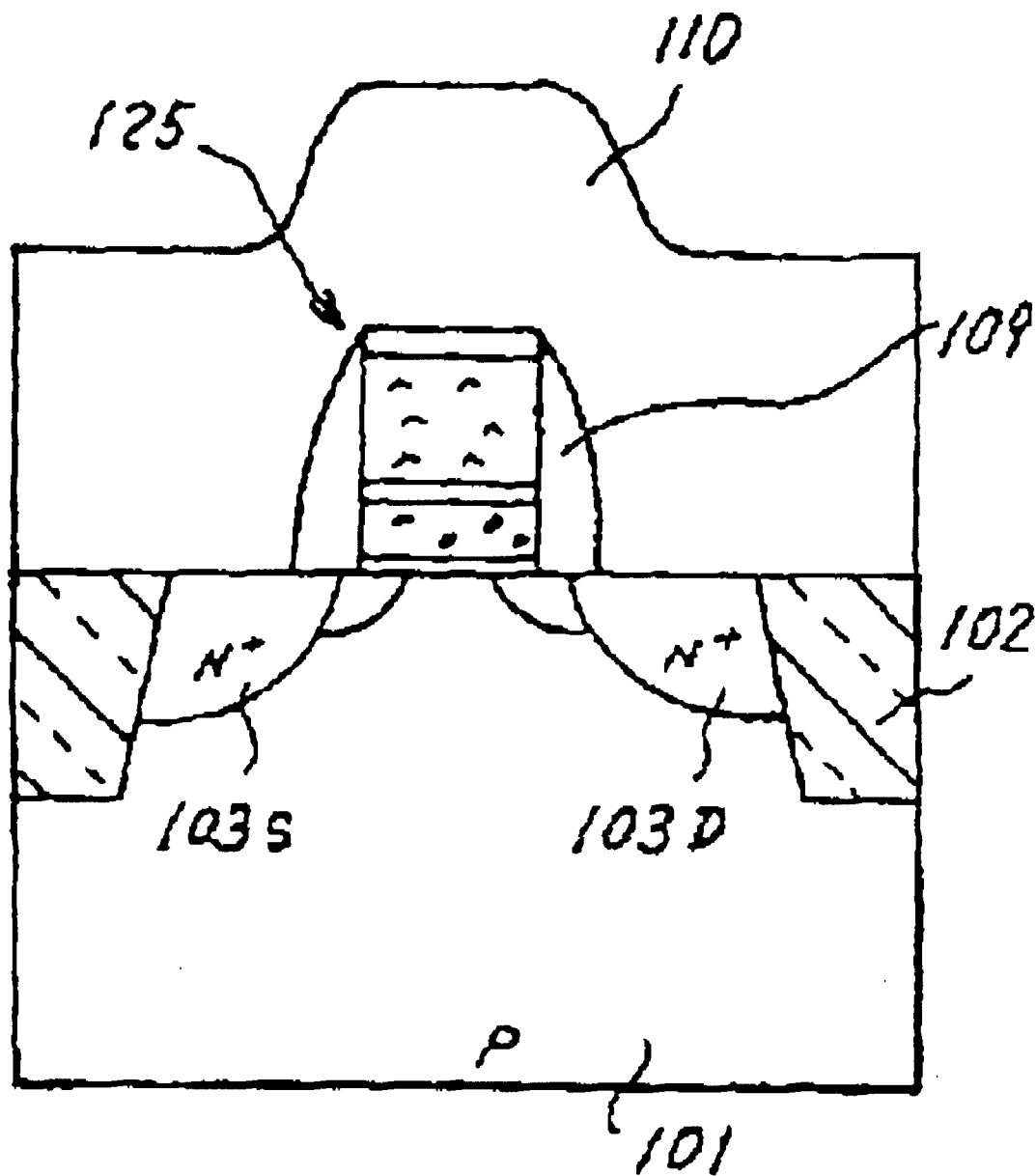

With reference to FIG. 5E, a first inter-layer insulator 110 having a thickness of 6000 angstroms is entirely formed over the shallow trench isolation regions 102, the $n^+$-type source and drain regions 103S and 103D, the side wall oxide films 109 and the gate structure 125 by a chemical vapor deposition, whereby the side wall oxide films 109 and the gate structure 125 are completely buried within the first inter-layer insulator 110. The first inter-layer insulator 110 comprise a boro-phospho-silicate glass film.

Figure 5F:
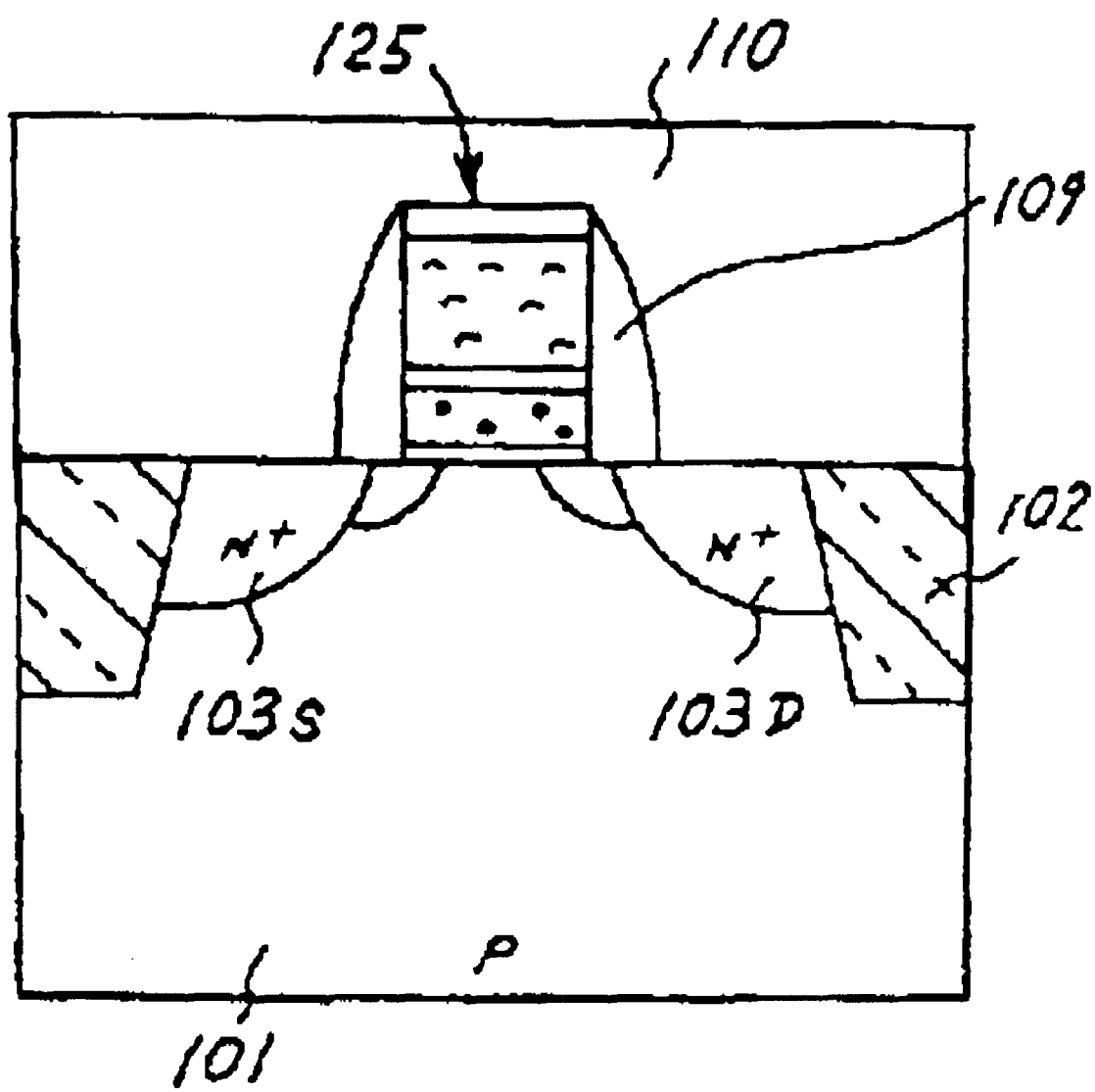

With reference to FIG. 5F, a chemical mechanical polishing process as a planarization process is carried out to the first inter-layer insulator 110, whereby a top surface of the first inter-layer insulator 110 is planarized. In this chemical mechanical polishing process, the top of the gate structure 125 is still buried in the first inter-layer insulator 110. The chemical mechanical polishing process is continued at a calculated time which is calculated from the etching rate. It is unnecessary to check or detect the terminating point of the chemical mechanical polishing process.

Figure 5G:
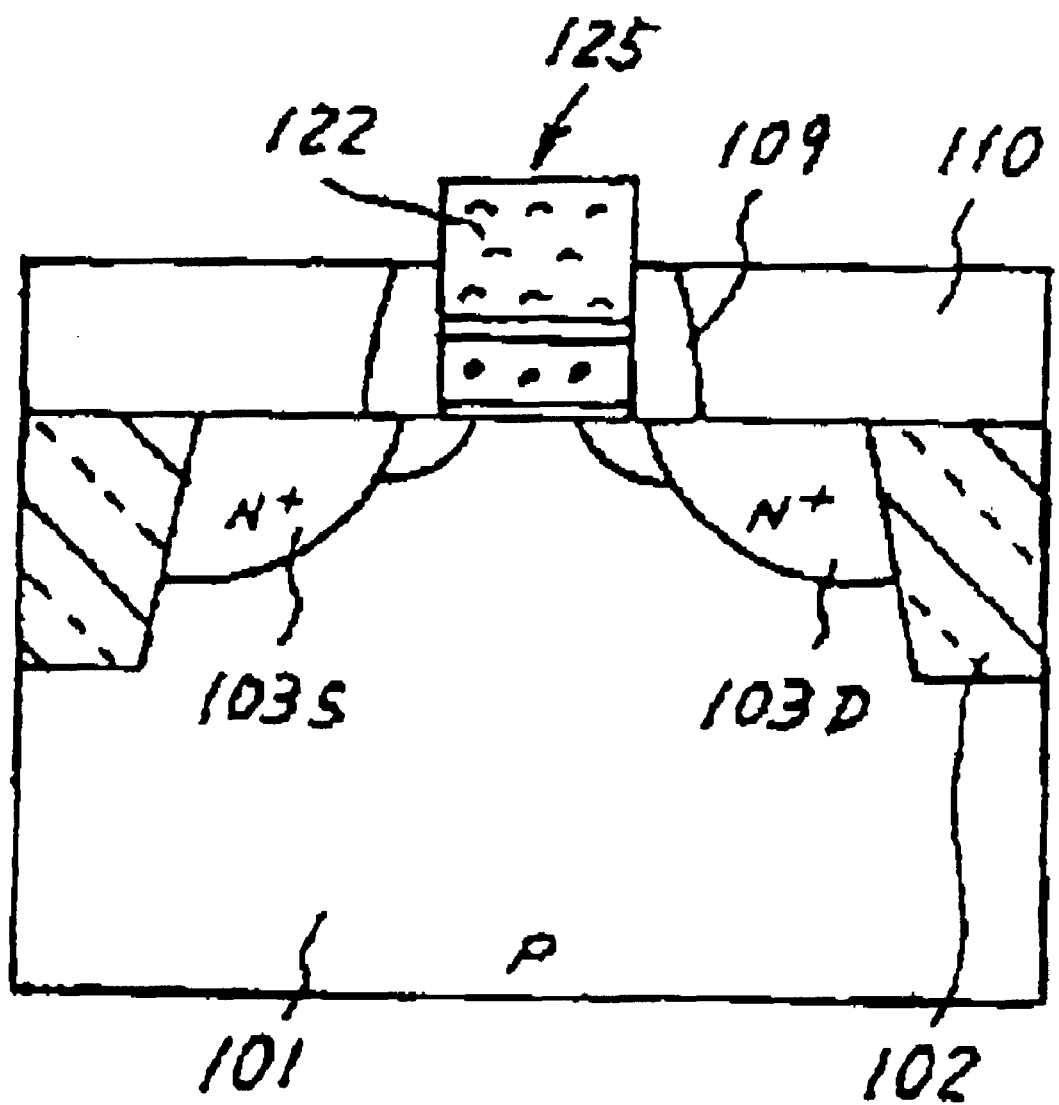

With reference to FIG. 5G, a first wet etching process is carried out for etching-back the first inter-layer insulator 110 and the gate structure 125 with the side wall oxide films 109, so that at least the top portion of the amorphous silicon dummy layer 122 is shown or projected, wherein the amorphous silicon dummy layer 122 is lower in etching rate than the first inter-layer insulator 110 and the side wall oxide films 109. By this first wet etching process, the anti-reflective layer 123 is removed.

Figure 5H:
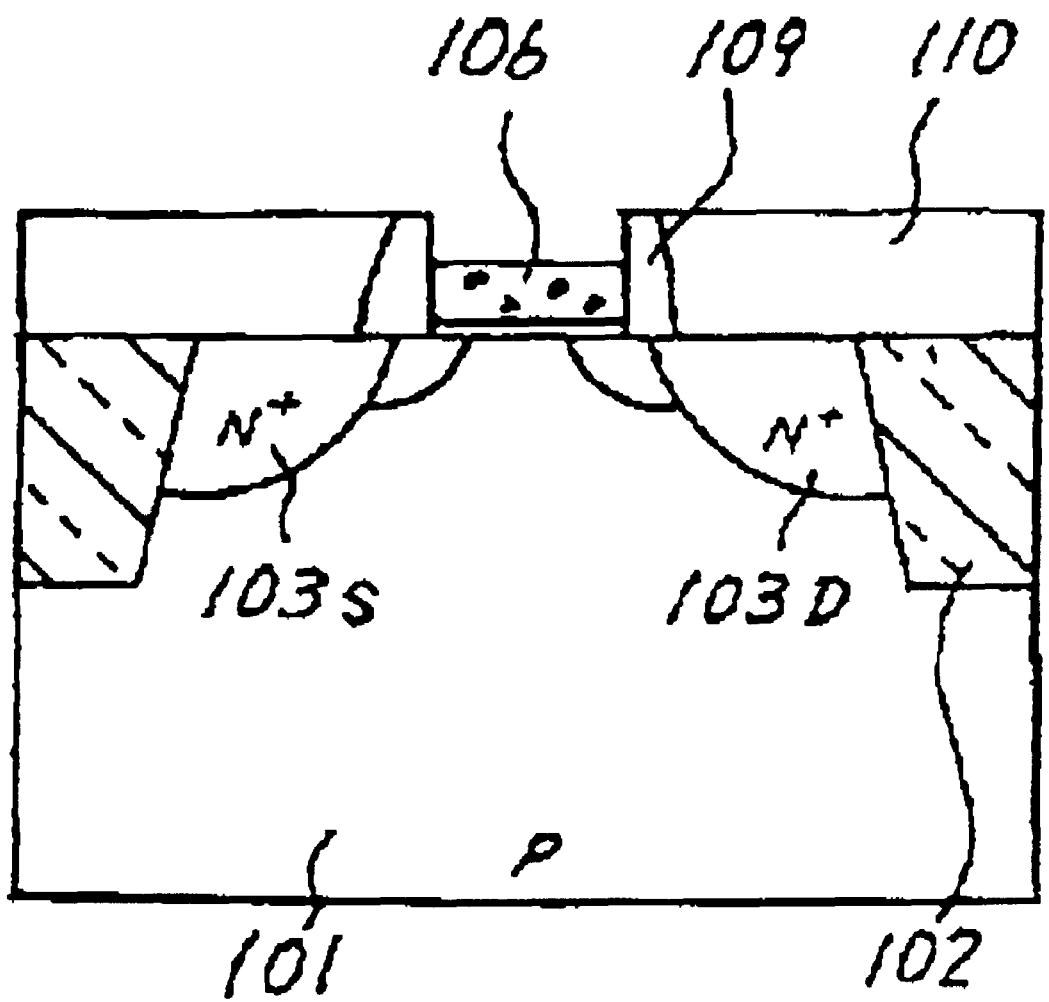

With reference to FIG. 5H, a dry etching process is carried out for removing the amorphous silicon dummy layer 122 by utilizing a difference in etching selectivity. As a result, the top surface of the silicon oxide film 121 over the polycrystalline silicon floating gate electrode layer 106 is shown.

Figure 5I:
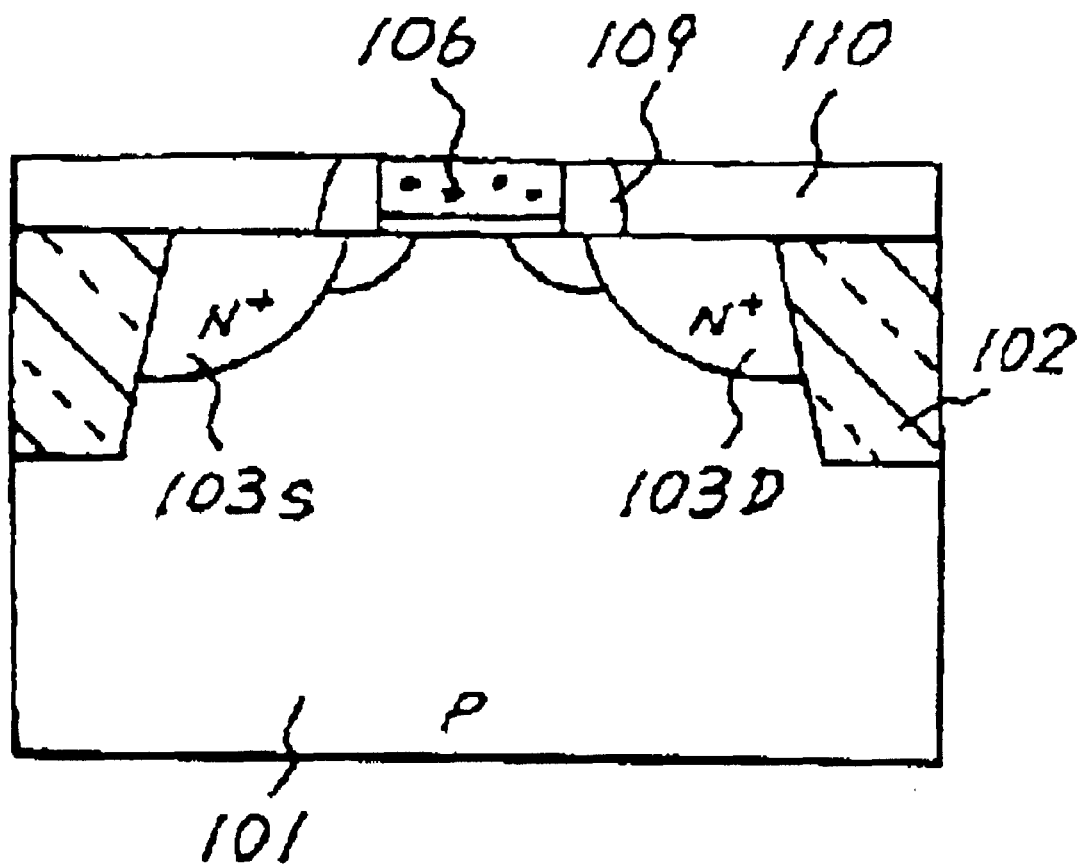

With reference to FIG. 5I, a second wet etching process is carried out for etching-back the first inter-layer insulator 110, the silicon oxide film 121 and the side wall oxide films 109, so that the silicon oxide film 121 is removed and the planarized top surfaces of the first inter-layer insulator 110 and the side wall oxide films 109 are leveled to the top surface of the polycrystalline silicon floating gate electrode layer 106 by utilizing the difference in the etching selectivity between the silicon oxide film 121 and the first inter-layer insulator 110 and the side wall oxide films 109.

Figure 5J:
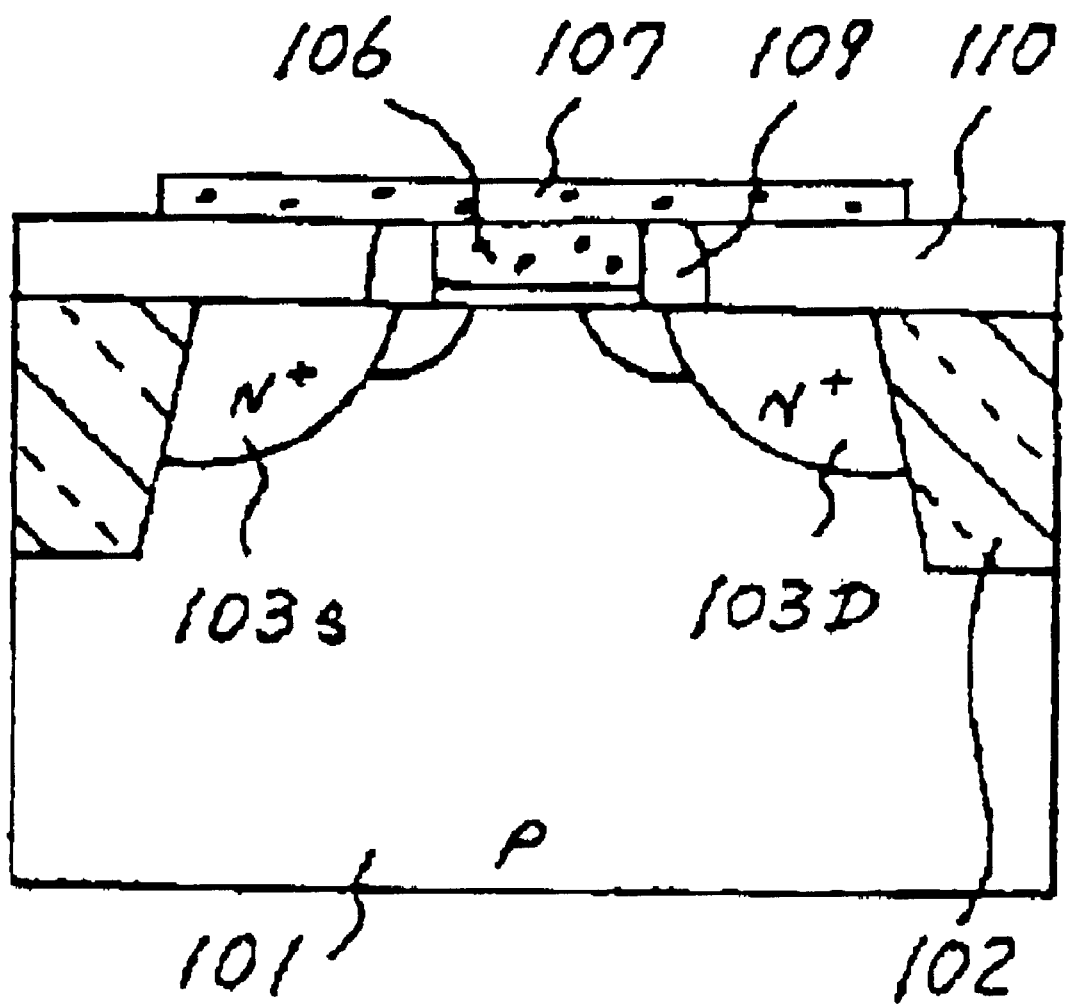

With reference to FIG. 5J, a second polycrystalline silicon film 107 having a thickness of about 1000 angstroms or less is entirely formed over the planarized top surfaces of the first inter-layer insulator 110, the side wall oxide films 109 and the polycrystalline silicon floating gate electrode layer 106. The second polycrystalline silicon film 107 is then patterned to form a polycrystalline silicon capacitive electrode layer 107. The polycrystalline silicon capacitive electrode layer 107 has a width sufficiently covering the polycrystalline silicon floating gate electrode layer 106. The polycrystalline silicon capacitive electrode layer 107 extends along the column direction perpendicular to the width direction. The polycrystalline silicon capacitive electrode layer 107 has a row direction size of about 0.7 micrometers.

Figure 5K:
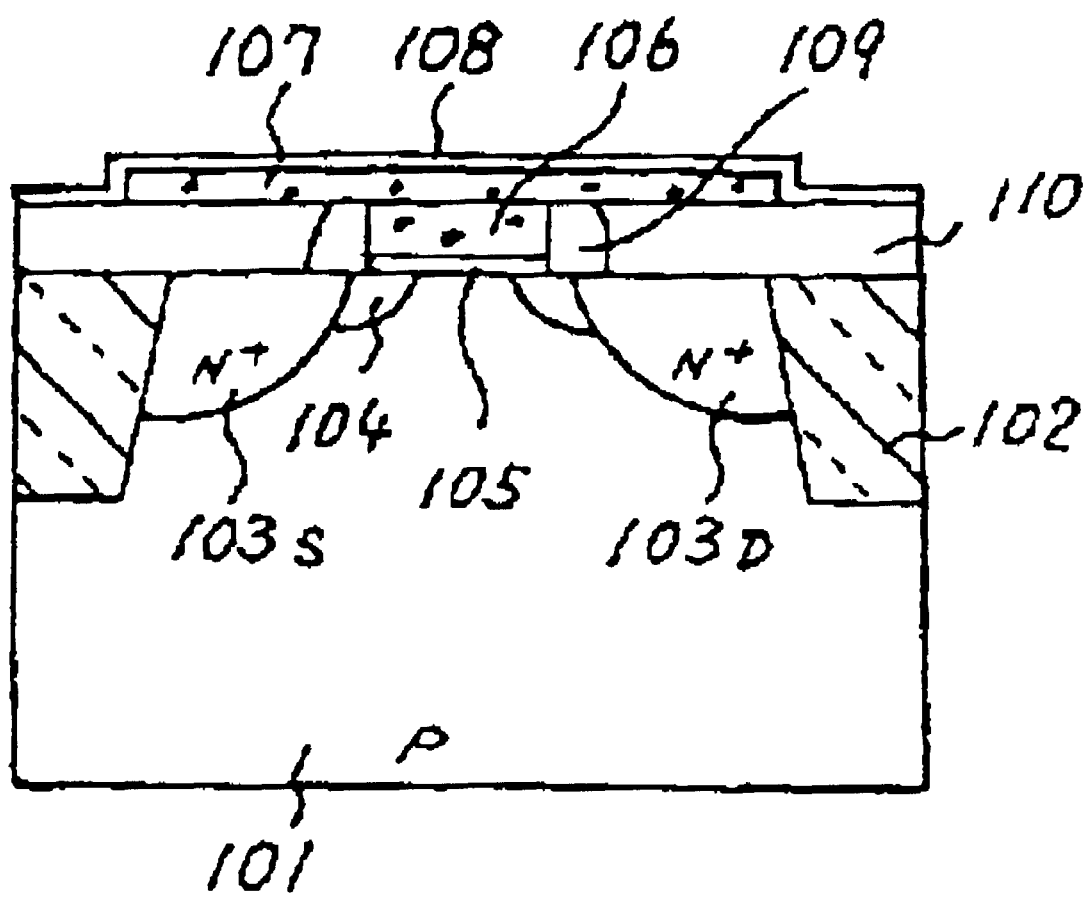

With reference to FIG. 5K, an ONO inter-gate insulator 108 is entirely formed on the polycrystalline silicon capacitive electrode layer 107 and the first inter-layer insulator 110. The ONO inter-gate insulator 108 comprises laminations of an oxide film, a nitride film and an oxide film.

Figure 5L:
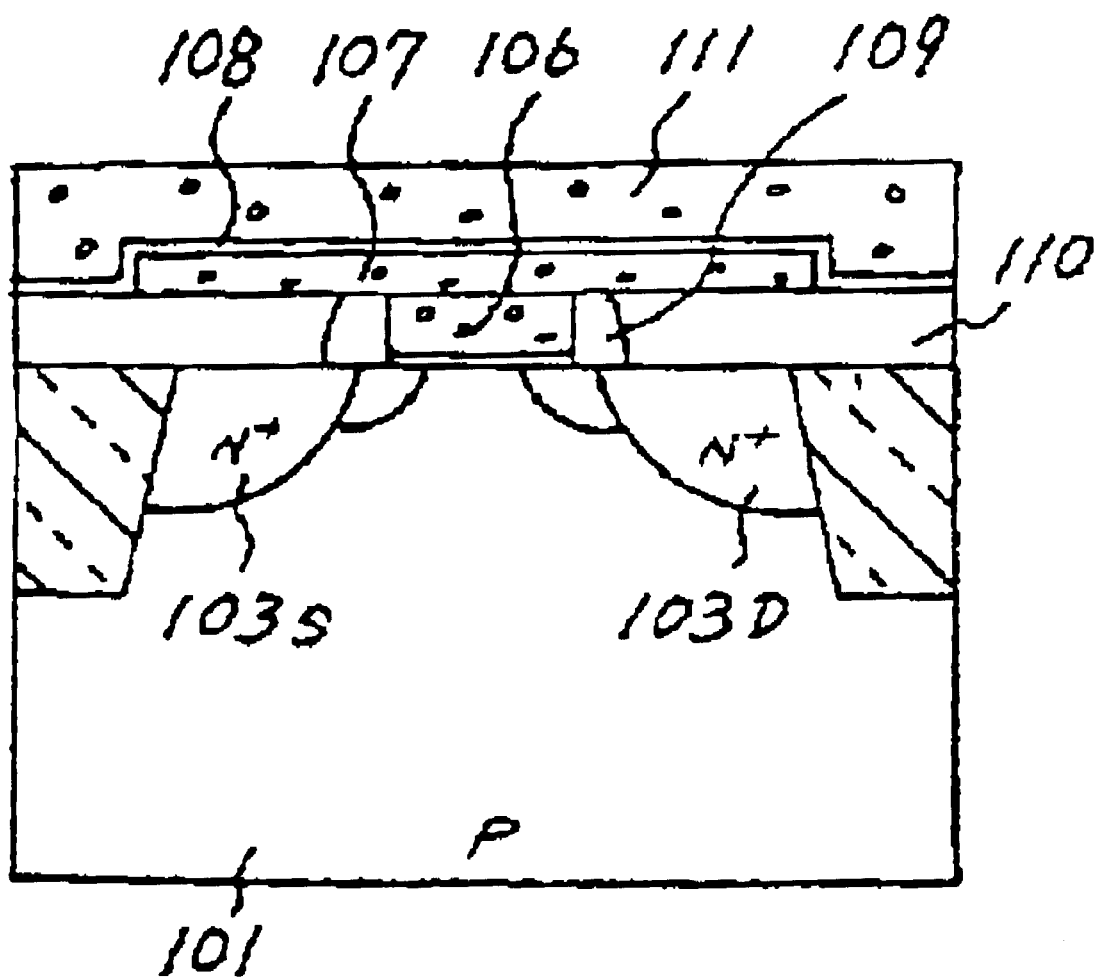

With reference to FIG. 5L, a third polycrystalline silicon film 111 having a thickness of about 1000 angstroms or more is entirely formed on the ONO inter-gate insulator 108. Laminations of the third polycrystalline silicon film 111, the ONO inter-gate insulator 108, the polycrystalline silicon capacitive electrode layer 107 and the polycrystalline silicon floating gate electrode layer 106 are selectively etched or patterned to have the laminations extend in the row direction. The third polycrystalline silicon film 111 and the ONO inter-gate insulator 108 have a column direction size of 0.22 micrometers. The adjacent two of the third polycrystalline silicon films 111 and the inter-gate insulators 108 have a column directional distance of 0.22 micrometers. The array of the non-volatile memory cells comprising the floating gate MOS field effect transistors are formed, wherein the non-volatile memory cells are aligned at a row directional distance of 0.68 micrometers and at a column directional distance of 0.44 micrometers. Each of the floating gate MOS field effect transistors as the non-volatile memory cells has a gate length of 0.22 micrometers.

As described above, the etching selectivity of the amorphous silicon dummy layer 122 to the resist pattern 124 is in the range of 1–2. The etching selectivity of the nitride layer to the resist pattern 124 is 0.56. Namely, the amorphous silicon dummy layer 122 is larger in etching selectivity to the resist pattern 124 than the nitride layer, for which reason opposite side edges of the resist film 124 are not over-etched, whereby a horizontal size of the resist film 124 remains unchanged from the designed size, even after the above gate structure 125 is completely defined by this etching process. The over-etching-free and size-reduction-free resist film 124 makes the amorphous silicon dummy layer 122 free from any over-etching in horizontal direction and remain unchanged in horizontal size, whereby the amorphous silicon dummy layer 122 remains unchanged in horizontal size, so that the horizontal size of the amorphous silicon dummy layer 122 is constant in the vertical direction or the thickness direction. Namely, the side walls of the amorphous silicon dummy layer 122 are just vertical. The cross sectional vertical shape of the amorphous silicon dummy layer 122 is rectangle. The over-etching-free and size-reduction-free resist film 124 further causes the silicon oxide film 121 and the polycrystalline silicon floating gate electrode layer 106 to be free from any over-etching in horizontal direction and to remain unchanged in horizontal size. The above horizontal size unchanges of the amorphous silicon dummy layer 122, the silicon oxide film 121 and the polycrystalline silicon floating gate electrode layer 106 means that the gate structure 125 remains unchanged in horizontal size. This means that the gate structure 125 remains unchanged in size in the gate length direction. The n$^-$-type lightly doped diffusion regions 104 are self-aligned to the edges of the gate structure 125. No variation in size in the gate length direction of the gate structure 125 causes no variation in position of the inner edges of the n$^-$-type lightly doped diffusion regions 104, whereby a channel length defined between the inner edges of the n$^-$-type lightly doped diffusion regions 104 remains unchanged. No variation in channel length causes no variations in characteristics and performances of the memory cells, for example, the necessary times of writing and erasing data, and ON-current for reading out data. This makes it possible to realize advanced memory cells having 0.22 micrometers gate length.

The amorphous silicon dummy layer 122 is used as the dummy layer for realizing the highly accurate plane size particularly in the gate length directional size of the polycrystalline silicon floating gate electrode layer 106. It is, therefore, impossible to utilize the conventional technique for detecting the polishing termination point in the chemical mechanical polishing process on the basis of the etching selectivity between the nitride film and the first inter-layer insulator 110 of boro-phospho-silicate glass. In accordance with the present invention, therefore, the chemical mechanical polishing process is stopped at the time when the top of the gate structure 125 is still buried within the first inter-layer insulator 110. This timing of stopping the chemical mechanical polishing process is decided depending upon the time. The first wet etching process is carried out for etching-back the first inter-layer insulator 110 and the gate structure 125 with the side wall oxide films 109, so that at least the top portion of the amorphous silicon dummy layer 122 is selectively shown or projected, because the amorphous silicon dummy layer 122 is lower in etching rate than the first inter-layer insulator 110 and the side wall oxide films 109. The dry etching process is carried out for removing the amorphous silicon dummy layer 122 by utilizing a difference in etching selectivity. Further, the second wet etching process is carried out for etching-back the first inter-layer insulator 110, the silicon oxide film 121 and the side wall oxide films 109, so that the silicon oxide film 121 is removed and the planarized top surfaces of the first inter-layer insulator 110 and the side wall oxide films 109 are leveled to the top surface of the polycrystalline silicon floating gate electrode layer 106 by utilizing the difference in the etching selectivity between the silicon oxide film 121 and the first inter-layer insulator 110 and the side wall oxide films 109. Namely, it is possible both that the highly accurate plane size particularly in the gate length directional size of the polycrystalline silicon floating gate electrode layer 106 is realized and that the planarized top surfaces of the first inter-layer insulator 110 and the side wall oxide films 109 are leveled to the top surface of the polycrystalline silicon floating gate electrode layer 106. No variation in size in the gate length direction of the gate structure 125 causes no variation in position of the inner edges of the n⁻-type lightly doped diffusion regions 104, whereby a channel length defined between the inner edges of the n⁻-type lightly doped diffusion regions 104 remains unchanged. No variation in channel length causes no variations in characteristics and performances of the memory cells, for example, the necessary times of writing and erasing data, and ON-current for reading out data. This makes it possible to realize advanced memory cells having 0.22 micrometers gate length.

In accordance with the present invention, it is also possible that the polycrystalline silicon floating gate electrode layer 106 and the amorphous silicon dummy layer 122 are etched in the same chamber for simplifying the fabrication processes. By contrast, in accordance with the conventional technique, it is necessary that the dummy layer made of nitride and the polycrystalline silicon floating gate electrode layer are etched in the different etching chambers.

As a first modification to the above first preferred embodiment of the present invention, it is possible that in place of the amorphous silicon dummy layer 122, the dummy layer may be made of polycrystalline silicon. The etching selectivity of the polycrystalline silicon dummy layer to the resist pattern is in the range of 1–2. In this case, it is advantageous that the polycrystalline silicon dummy layer and the polycrystalline silicon floating gate electrode layer 106 are etched in the same chamber under the same conditions. Further, the polycrystalline silicon dummy layer has a crystal structure, for which reason it is possible that crystal grains are shown on the vertical side walls of the gate structure 125, whereby the vertical side walls of the gate structure 125 has a surface roughness due to the crystal grains. If the influence of the surface roughness due to the crystal grains to the gate length or the channel length is not so problem, the polycrystalline silicon dummy layer is suitable. The etching selectivity of the polycrystalline silicon dummy layer to the resist pattern 124 is in the range of 1–2. The etching selectivity of the nitride layer to the resist pattern 124 is 0.56. Namely, the polycrystalline silicon dummy layer is larger in etching selectivity to the resist pattern 124 than the nitride layer, for which reason opposite side edges of the resist film 124 are not over-etched, whereby a horizontal size of the resist film 124 remains unchanged from the designed size, even after the above gate structure 125 is completely defined by this etching process. The over-etching-free and size-reduction-free resist film 124 makes the polycrystalline silicon dummy layer free from any over-etching in horizontal direction and remain unchanged in horizontal size, whereby the polycrystalline silicon dummy layer remains unchanged in horizontal size, so that the horizontal size of the polycrystalline silicon dummy layer is constant in the vertical direction or the thickness direction. Namely, the side walls of the polycrystalline silicon dummy layer are just vertical. The cross sectional vertical shape of the polycrystalline silicon dummy layer is rectangle. The over-etching-free and size-reduction-free resist film 124 further causes the silicon oxide film 121 and the polycrystalline silicon floating gate electrode layer 106 to be free from any over-etching in horizontal direction and to remain unchanged in horizontal size. The above horizontal size unchanges of the polycrystalline silicon dummy layer, the silicon oxide film 121 and the polycrystalline silicon floating gate electrode layer 106 means that the gate structure 125 remains unchanged in horizontal size. This means that the gate structure 125 remains unchanged in size in the gate length direction. The n⁻-type lightly doped diffusion regions 104 are self-aligned to the edges of the gate structure 125. No variation in size in the gate length direction of the gate structure 125 causes no variation in position of the inner edges of the n⁻-type lightly doped diffusion regions 104, whereby a channel length defined between the inner edges of the n⁻-type lightly doped diffusion regions 104 remains unchanged. No variation in channel length causes no variations in characteristics and performances of the memory cells, for example, the necessary times of writing and erasing data, and ON-current for reading out data. This makes it possible to realize advanced memory cells having 0.22 micrometers gate length.

As a second modification to the above first preferred embodiment of the present invention, it is possible that in place of the amorphous silicon dummy layer 122, the dummy layer may be made of CVD oxide. The etching selectivity of the CVD oxide dummy layer to the resist pattern is about 0.7. The etching selectivity of the nitride layer to the resist pattern 124 is 0.56. Namely, the CVD oxide dummy layer is larger in etching selectivity to the resist pattern 124 than the nitride layer, for which reason opposite side edges of the resist film 124 are not over-etched, whereby a horizontal size of the resist film 124 remains unchanged from the designed size, even after the above gate structure 125 is completely defined by this etching process. The over-etching-free and size-reduction-free resist film 124 makes the CVD oxide dummy layer free from any over-etching in horizontal direction and remain unchanged in horizontal size, whereby the CVD oxide dummy layer remains unchanged in horizontal size, so that the horizontal size of the CVD oxide dummy layer is constant in the vertical direction or the thickness direction. Namely, the side walls of the CVD oxide dummy layer are just vertical. The cross sectional vertical shape of the CVD oxide dummy layer is rectangle. The over-etching-free and size-reduction-free resist film 124 further causes the silicon oxide film 121 and the polycrystalline silicon floating gate electrode layer 106 to be free from any over-etching in horizontal direction and to remain unchanged in horizontal size. The above horizontal size unchanges of the CVD oxide dummy layer, the silicon oxide film 121 and the polycrystalline silicon floating gate electrode layer 106 means that the gate structure 125 remains unchanged in horizontal size. This means that the gate structure 125 remains unchanged in size in the gate length direction. The n⁻-type lightly doped diffusion regions 104 are self-aligned to the edges of the gate structure 125. No variation in size in the gate length direction of the gate structure 125 causes no variation in position of the inner edges of the n⁻-type lightly doped diffusion regions 104, whereby a channel length defined between the inner edges of the n⁻-type lightly doped diffusion regions 104 remains unchanged. No variation in channel length causes no variations in characteristics and performances of the memory cells, for example, the necessary times of writing and erasing data, and ON-current for reading out data. This makes it possible to realize advanced memory cells having 0.22 micrometers gate length.

As a third modification to the above first preferred embodiment of the present invention, it is possible that in place of the amorphous silicon dummy layer 122, the dummy layer may be made of plasma oxide. The etching selectivity of the plasma oxide dummy layer to the resist pattern is about 0.7. The etching selectivity of the nitride layer to the resist pattern 124 is 0.56. Namely, the plasma oxide dummy layer is larger in etching selectivity to the resist pattern 124 than the nitride layer, for which reason opposite side edges of the resist film 124 are not over-etched, whereby a horizontal size of the resist film 124 remains unchanged from the designed size, even after the above gate structure 125 is completely defined by this etching process. The over-etching-free and size-reduction-free resist film 124 makes the plasma oxide dummy layer free from any over-etching in horizontal direction and remain unchanged in horizontal size, whereby the plasma oxide dummy layer remains unchanged in horizontal size, so that the horizontal size of the plasma oxide dummy layer is constant in the vertical direction or the thickness direction. Namely, the side walls of the plasma oxide dummy layer are just vertical. The cross sectional vertical shape of the plasma oxide dummy layer is rectangle. The over-etching-free and size-reduction-free resist film 124 further causes the silicon oxide film 121 and the polycrystalline silicon floating gate electrode layer 106 to be free from any over-etching in horizontal direction and to remain unchanged in horizontal size. The above horizontal size unchanges of the plasma oxide dummy layer, the silicon oxide film 121 and the polycrystalline silicon floating gate electrode layer 106 means that the gate structure 125 remains unchanged in horizontal size. This means that the gate structure 125 remains unchanged in size in the gate length direction. The n⁻-type lightly doped diffusion regions 104 are self-aligned to the edges of the gate structure 125. No variation in size in the gate length direction of the gate structure 125 causes no variation in position of the inner edges of the n⁻-type lightly doped diffusion regions 104, whereby a channel length defined between the inner edges of the n⁻-type lightly doped diffusion regions 104 remains unchanged. No variation in channel length causes no variations in characteristics and performances of the memory cells, for example, the necessary times of writing and erasing data, and ON-current for reading out data. This makes it possible to realize advanced memory cells having 0.22 micrometers gate length.

As a fourth modification to the above first preferred embodiment of the present invention, it is possible that in place of the amorphous silicon dummy layer 122, the dummy layer may be made of boro-phospho-silicate-glass. The etching selectivity of the boro-phospho-silicate-glass dummy layer to the resist pattern is about 0.7. The etching selectivity of the nitride layer to the resist pattern 124 is 0.56. Namely, the boro-phospho-silicate-glass dummy layer is larger in etching selectivity to the resist pattern 124 than the nitride layer, for which reason opposite side edges of the resist film 124 are not over-etched, whereby a horizontal size of the resist film 124 remains unchanged from the designed size, even after the above gate structure 125 is completely defined by this etching process. The over-etching-free and size-reduction-free resist film 124 makes the boro-phospho-silicate-glass dummy layer free from any over-etching in horizontal direction and remain unchanged in horizontal size, whereby the boro-phospho-silicate-glass dummy layer remains unchanged in horizontal size, so that the horizontal size of the boro-phospho-silicate-glass dummy layer is constant in the vertical direction or the thickness direction. Namely, the side walls of the boro-phospho-silicate-glass dummy layer are just vertical. The cross sectional vertical shape of the boro-phospho-silicate-glass dummy layer is rectangle. The over-etching-free and size-reduction-free resist film 124 further causes the silicon oxide film 121 and the polycrystalline silicon floating gate electrode layer 106 to be free from any over-etching in horizontal direction and to remain unchanged in horizontal size. The above horizontal size unchanges of the boro-phospho-silicate-glass dummy layer, the silicon oxide film 121 and the polycrystalline silicon floating gate electrode layer 106 means that the gate structure 125 remains unchanged in horizontal size. This means that the gate structure 125 remains unchanged in size in the gate length direction. The n⁻-type lightly doped diffusion regions 104 are self-aligned to the edges of the gate structure 125. No variation in size in the gate length direction of the gate structure 125 causes no variation in position of the inner edges of the n⁻-type lightly doped diffusion regions 104, whereby a channel length defined between the inner edges of the n⁻-type lightly doped diffusion regions 104 remains unchanged. No variation in channel length causes no variations in characteristics and performances of the memory cells, for example, the necessary times of writing and erasing data, and ON-current for reading out data. This makes it possible to realize advanced memory cells having 0.22 micrometers gate length.

As a fifth modification to the above first preferred embodiment of the present invention, it is possible that in place of the amorphous silicon dummy layer 122, the dummy layer may be made of polycrystalline silicon and further in place of the polycrystalline silicon floating gate electrode layer 106, an amorphous silicon floating gate electrode layer is used. In this case, it is advantageous that the amorphous silicon dummy layer and the amorphous silicon floating gate electrode layer are etched in the same chamber under the same conditions.

Figure 6:
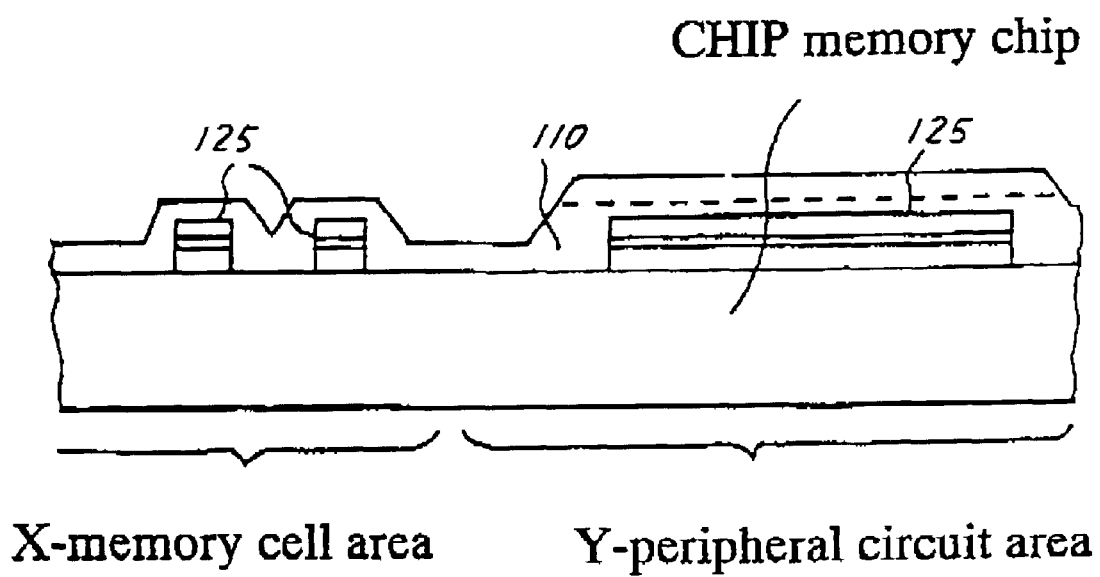
FIG. 6 is a fragmentary cross sectional elevation view illustrative of a semiconductor device having a memory cell area and a peripheral circuit area.

FIG. 6 is a fragmentary cross sectional elevation view illustrative of a semiconductor device having a memory cell area and a peripheral circuit area. The above novel memory cell arrays are formed in the memory cell area which is surrounded by the peripheral circuit area. MOS field effect transistors having large gate lengths are formed in the peripheral circuit area in the same processes as in the processes for forming the memory cells. In the above chemical mechanical polishing process shown in FIG. 5F, the volume of the first inter-layer insulator 110 in the peripheral circuit area is much larger than the volume of the first inter-layer insulator 110 in the memory cell area. This may make it difficult to realize a highly accurate planarization of the first inter-layer insulator 110 by the chemical mechanical polishing process. In this case, it is effective for realizing the highly accurate planarization of the first inter-layer insulator 110 that after the first inter-layer insulator 110 has been formed, then a selective etching is carried out for selectively etching the first inter-layer insulator 110 but only on the peripheral circuit area by a predetermined thickness, before a thin silicon nitride film not illustrated is entirely formed on the first inter-layer insulator 110 over the memory cell area and the peripheral circuit area, prior to the chemical mechanical polishing process is carried out to the first inter-layer insulator 110 over the memory cell area and the peripheral circuit area. This makes it possible to realize the highly accurate planarization of the first inter-layer insulator 110 over the memory cell area and the peripheral circuit area.

Alternatively, it is also effective for realizing the highly accurate planarization of the first inter-layer insulator 110 that after the first inter-layer insulator 110 has been formed, then a thin silicon nitride film not illustrated is entirely formed on the first inter-layer insulator 110 over the memory cell area and the peripheral circuit area, before a selective etching is carried out for selectively etching the first inter-layer insulator 110 but only on the peripheral circuit area by a predetermined thickness, prior to the chemical mechanical polishing process is carried out to the first inter-layer insulator 110 over the memory cell area and the peripheral circuit area. This makes it possible to realize the highly accurate planarization of the first inter-layer insulator 110 over the memory cell area and the peripheral circuit area.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of patterning a conductive layer buried in an inter-layer insulator, said method comprising the steps of:
   forming a dummy layer over a conductive layer;
   selectively forming a resist pattern over said dummy layer;
   carrying out an anisotropic etching process for patterning said dummy layer and said conductive layer by use of said resist pattern as a mask;
   removing said resist pattern;
   forming an inter-layer insulator so that said dummy layer and said conductive layer are completely buried within said inter-layer insulator;
   carrying out a first planarization process for polishing said inter-layer insulator; and
   carrying out a second planarization process for selectively etching said inter-layer insulator, so that at least a top portion of said dummy layer is etched;
   removing said dummy layer;
   carrying out a third planarization process for selectively etching said inter-layer insulator, so that a planarized surface of said inter-layer insulator is leveled to a planarized surface of said conductive layer,
   wherein said dummy layer has a higher etching selectivity to said inter-layer insulator than nitride.

2. The method as claimed in claim 1, wherein said dummy layer comprises an amorphous silicon layer.

3. The method as claimed in claim 1, wherein said dummy layer comprises a polycrystalline silicon layer.

4. The method as claimed in claim 1, wherein said dummy layer comprises a CVD oxide layer.

5. The method as claimed in claim 1, wherein said dummy layer comprises a plasma enhanced silicon oxide layer.

6. The method as claimed in claim 1, wherein said dummy layer comprises a boro-phospho-silicate glass layer.

7. The method as claimed in claim 1, wherein said second and third planarization processes are plasma etching processes.

8. The method as claimed in claim 1, wherein said second and third planarization processes are wet etching processes.

9. The method as claimed in claim 1, wherein said first planarization process is a chemical mechanical polishing process.

10. The method as claimed in claim 1, wherein said dummy layer is removed by a dry etching process.

11. The method as claimed in claim 1, wherein said conductive layer comprises an impurity-doped polycrystalline silicon layer.

12. The method as claimed in claim 11, further comprising the step of:
   forming a silicon oxide film on said polycrystalline silicon layer before said dummy layer is formed on said silicon oxide film and over said polycrystalline silicon layer.

13. The method as claimed in claim 11, further comprising the step of:
   forming an antireflective layer on said dummy layer before said resist film is selectively formed on said antireflective layer and over said dummy layer.

14. The method as claimed in claim 1, wherein said first inter-layer insulator comprises a boro-phospho-silicate glass film.

15. The method as claimed in claim 1, wherein said dummy layer and said conductive layer as patterned have a width of not more than about 0.22 micrometers.

16. A method of forming a gate structure of a floating gate MOS field effect transistor, said method comprising the steps of:
   forming a conductive layer on a gate insulating film;
   forming a dummy layer over said conductive layer;
   selectively forming a resist pattern over said dummy layer;
   carrying out an anisotropic etching process for patterning said dummy layer and said conductive layer by use of said resist pattern as a mask, thereby to form a gate structure;
   removing said resist pattern;
   forming side wall insulation films on side walls of said gate structure;
   forming an inter-layer insulator so that said gate structure and said side wall insulation films are completely buried within said inter-layer insulator;
   carrying out a first planarization process for polishing said inter-layer insulator; and
   carrying out a second planarization process for selectively etching said inter-layer insulator and said side wall insulation films, so that at least a top portion of said dummy layer is etched;
   removing said dummy layer;
   carrying out a third planarization process for selectively etching said inter-layer insulator and said side wall insulation films, so that a planarized surface of said inter-layer insulator and said side wall insulation films is leveled to a planarized surface of said conductive layer,
   wherein said dummy layer has a higher etching selectivity to said inter-layer insulator than nitride.

17. The method as claimed in claim 16, wherein said dummy layer comprises an amorphous silicon layer.

18. The method as claimed in claim 16, wherein said dummy layer comprises a polycrystalline silicon layer.

19. The method as claimed in claim 16, wherein said dummy layer comprises a CVD oxide layer.

20. The method as claimed in claim 16, wherein said dummy layer comprises a plasma enhanced silicon oxide layer.

21. The method as claimed in claim 16, wherein said dummy layer comprises a boro-phospho-silicate glass layer.

22. The method as claimed in claim 16, wherein said second and third planarization processes are plasma etching processes.

23. The method as claimed in claim 16, wherein said second and third planarization processes are wet etching processes.

24. The method as claimed in claim 16, wherein said first planarization process is a chemical mechanical polishing process.

25. The method as claimed in claim 16, wherein said dummy layer is removed by a dry etching process.

26. The method as claimed in claim 16, wherein said conductive layer comprises an impurity-doped polycrystalline silicon layer.

27. The method as claimed in claim 26, further comprising the step of:

forming a silicon oxide film on said polycrystalline silicon layer before said dummy layer is formed on said silicon oxide film and over said polycrystalline silicon layer.

28. The method as claimed in claim 26, further comprising the step of:

forming an antireflective layer on said dummy layer before said resist film is selectively formed on said antireflective layer and over said dummy layer.

29. The method as claimed in claim 16, wherein said first inter-layer insulator comprises a boro-phospho-silicate glass film.

30. The method as claimed in claim 16, wherein said dummy layer and said conductive layer as patterned have a width of not more than about 0.22 micrometers.

31. The method as claimed in claim 16, further comprising the steps of:

selectively forming a capacitive conductive film extending on at least an entire top surface region of said conductive layer, so that said capacitive conductive film and said conductive layer forms a floating gate electrode;

forming an inter-gate insulation film over said capacitive conductive film;

forming a second conductive film over said capacitive insulation film, wherein said second conductive film forms a control gate electrode.

* * * * *